(12) United States Patent
Mochizuki et al.

(10) Patent No.: US 7,675,016 B2
(45) Date of Patent: Mar. 9, 2010

(54) SOLID-STATE IMAGE PICKUP DEVICE AND METHOD OF PRODUCING THE SAME

(75) Inventors: Chihiro Mochizuki, Ome (JP); Hiroshi Kikuchi, Hidaka (JP); Akira Arimoto, Tokyo (JP); Masaru Eguchi, Saitama (JP); Shinichi Arai, Tokyo (JP)

(73) Assignees: Hitachi, Ltd., Tokyo (JP); Pentax Corporation, Tokyo (JP)

( * ) Notice: Subject to any disclaimer, the term of this patent is extended or adjusted under 35 U.S.C. 154(b) by 368 days.

(21) Appl. No.: 11/840,671

(22) Filed: Aug. 17, 2007

(65) Prior Publication Data
US 2008/0043127 A1 Feb. 21, 2008

(30) Foreign Application Priority Data
Aug. 21, 2006 (JP) ............................. 2006-223958
Nov. 6, 2006 (JP) ............................. 2006-300239

(51) Int. Cl.
*H01L 27/14* (2006.01)

(52) U.S. Cl. ..................... 250/208.1; 250/239; 257/433
(58) Field of Classification Search .............. 250/208.1, 250/239; 257/431, 433, 688; 348/294, E5.091
See application file for complete search history.

(56) References Cited

U.S. PATENT DOCUMENTS

| 2008/0043127 A1* | 2/2008 | Mochizuki et al. .......... 348/294 |
| 2008/0185709 A1* | 8/2008 | Ishihara et al. .............. 257/698 |
| 2009/0046183 A1* | 2/2009 | Nishida et al. .............. 348/294 |
| 2009/0053850 A1* | 2/2009 | Nishida et al. ................ 438/64 |

FOREIGN PATENT DOCUMENTS

| JP | 10-108078 A | 4/1998 |
| JP | 2003-243635 A | 8/2003 |
| JP | 2004-146633 A | 5/2004 |
| JP | 2004-349545 A | 12/2004 |

* cited by examiner

*Primary Examiner*—John R Lee
(74) *Attorney, Agent, or Firm*—Miles & Stockbridge P.C.

(57) ABSTRACT

A solid-state image pickup device including a substrate having a first face and a second face which serves as an opposite face of the first face; a solid-state image pickup element having a plurality of electrodes and a light sensing part, an opposite face of the light sensing part being bonded to the first face via a bonding agent; a plurality of wires formed over the face, first ends of the wires serving as external electrode terminals; and a connection part for electrically connecting the electrodes to the wires, wherein an endless-shaped contraction frame formed of resin larger in thermal expansion coefficient than the substrate and image pickup element is bonded to and formed on surface of the substrate located outside the light sensing part so as to surround the light sensing part, and a light sensing face of the light sensing part is warped.

10 Claims, 24 Drawing Sheets

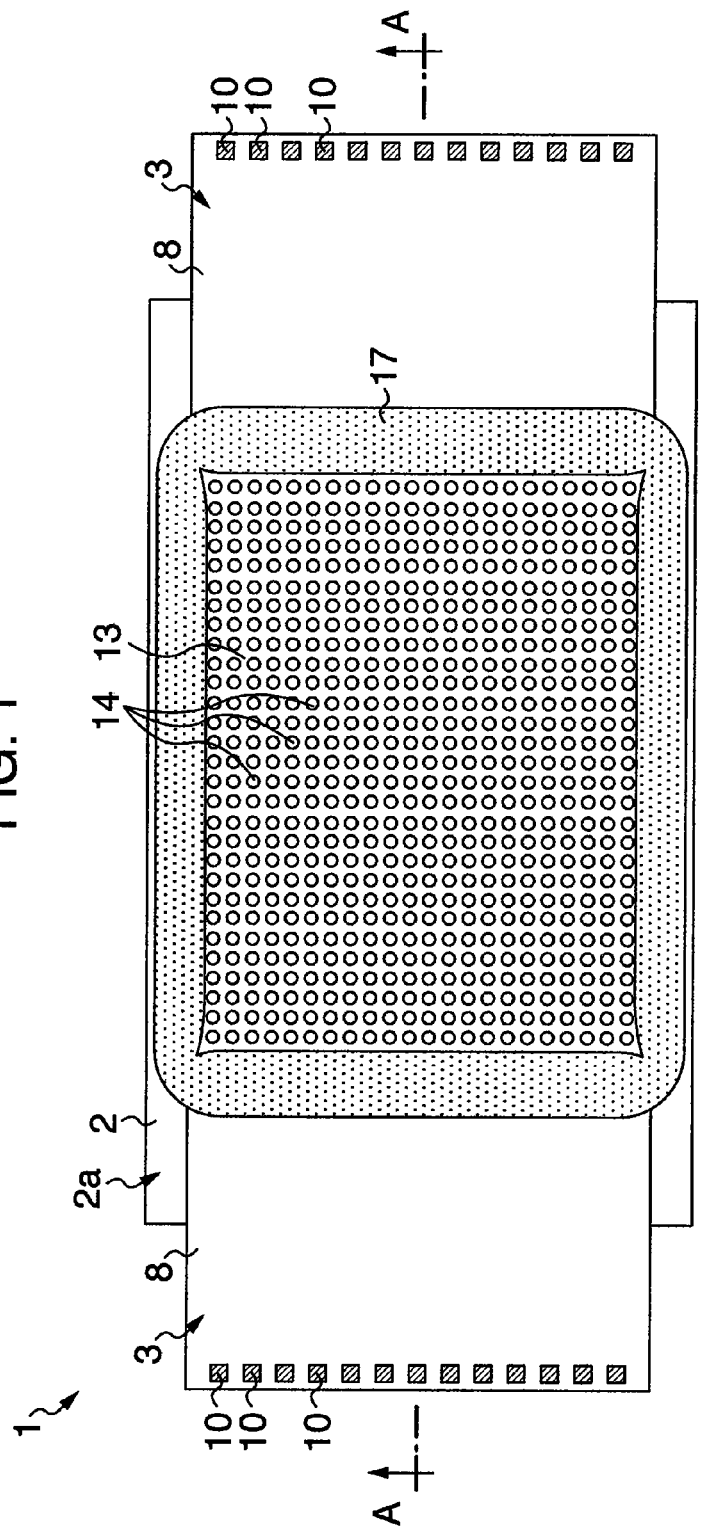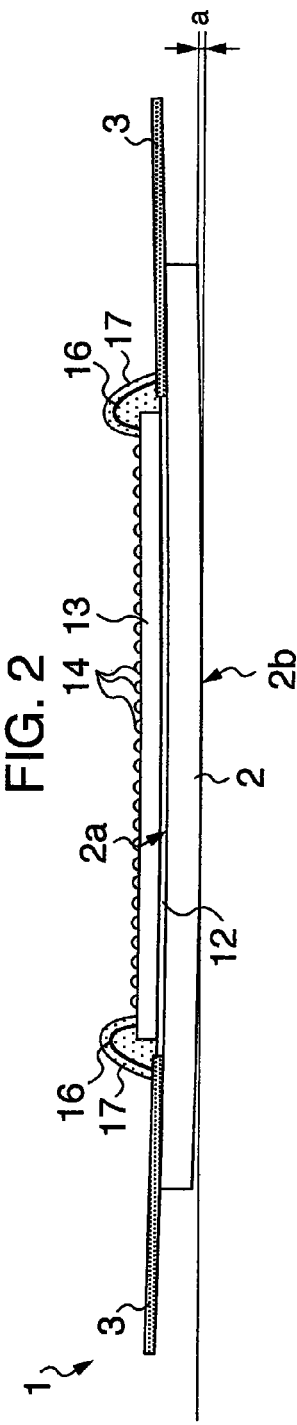

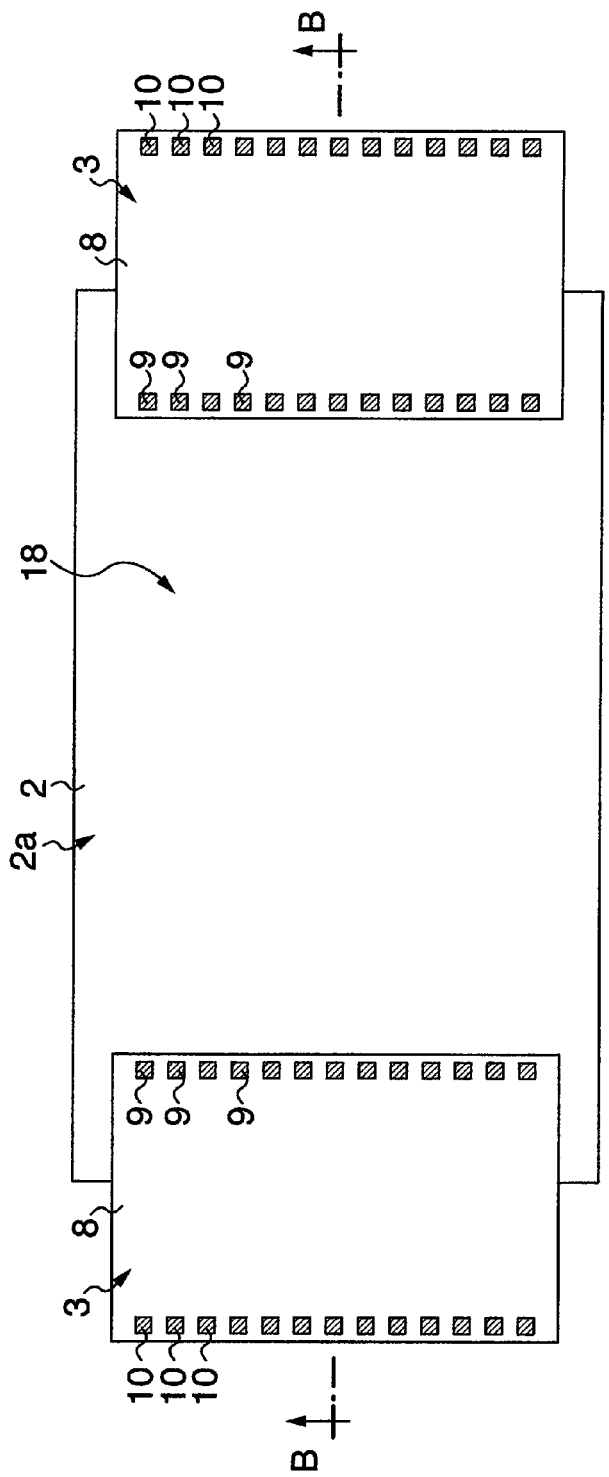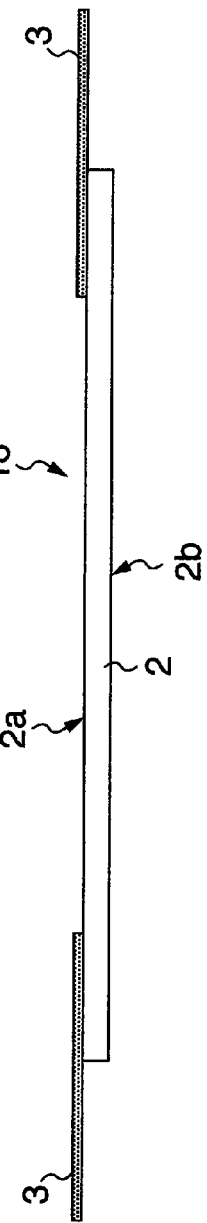

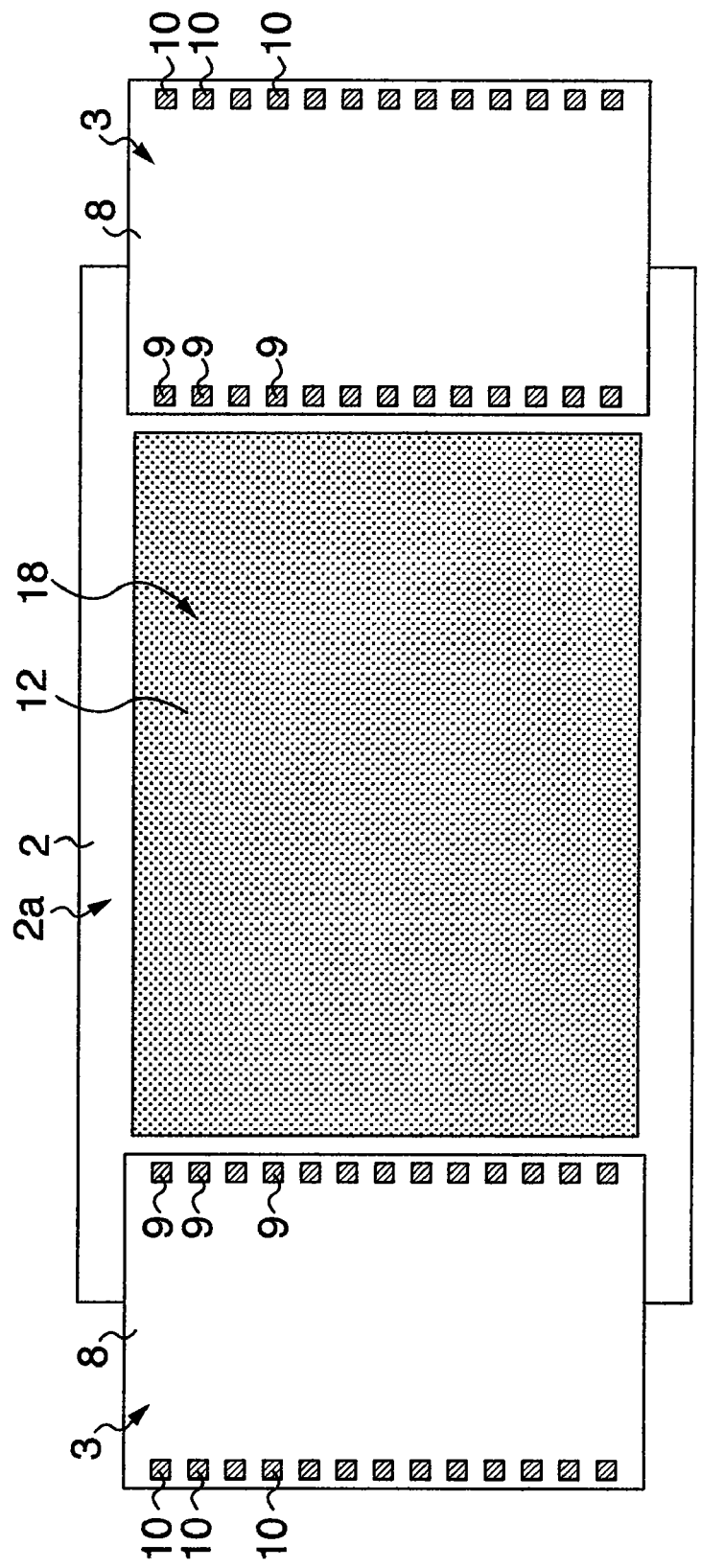

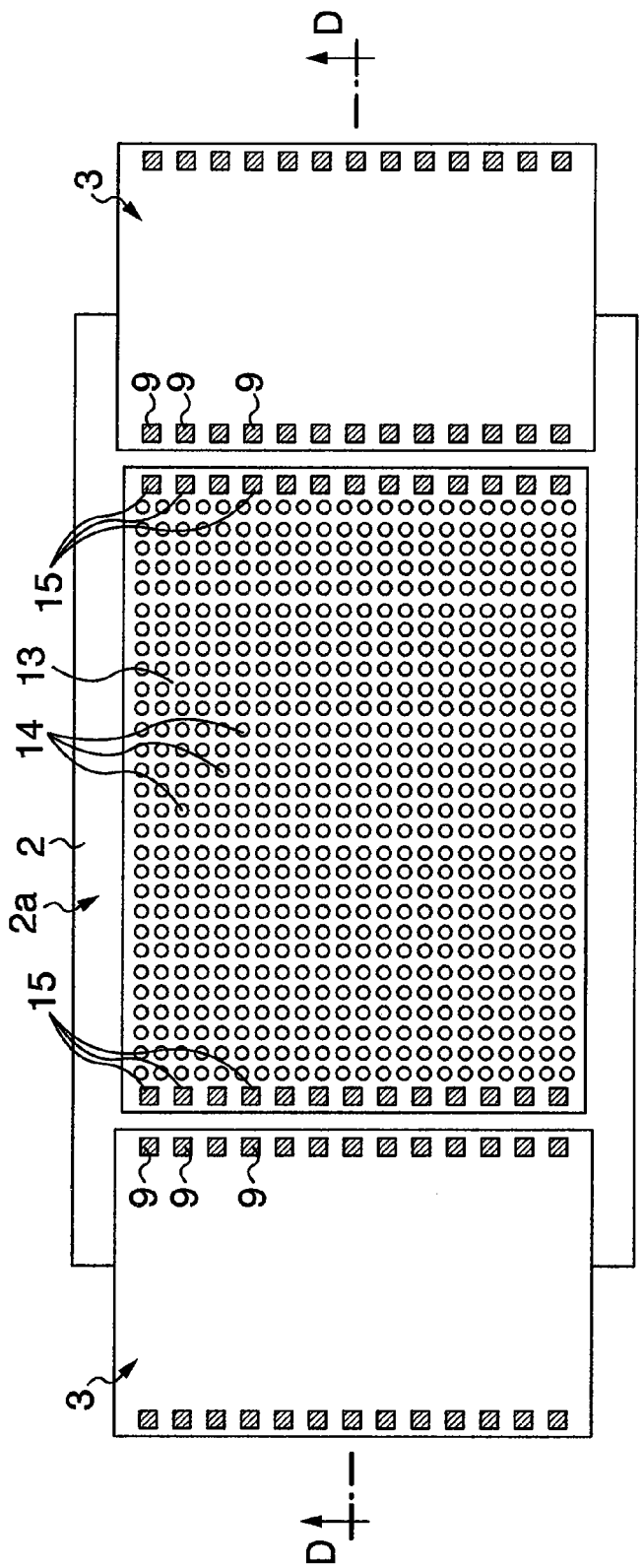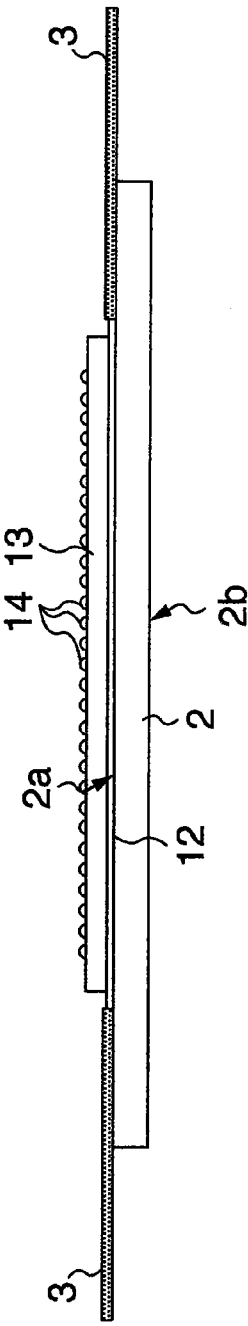

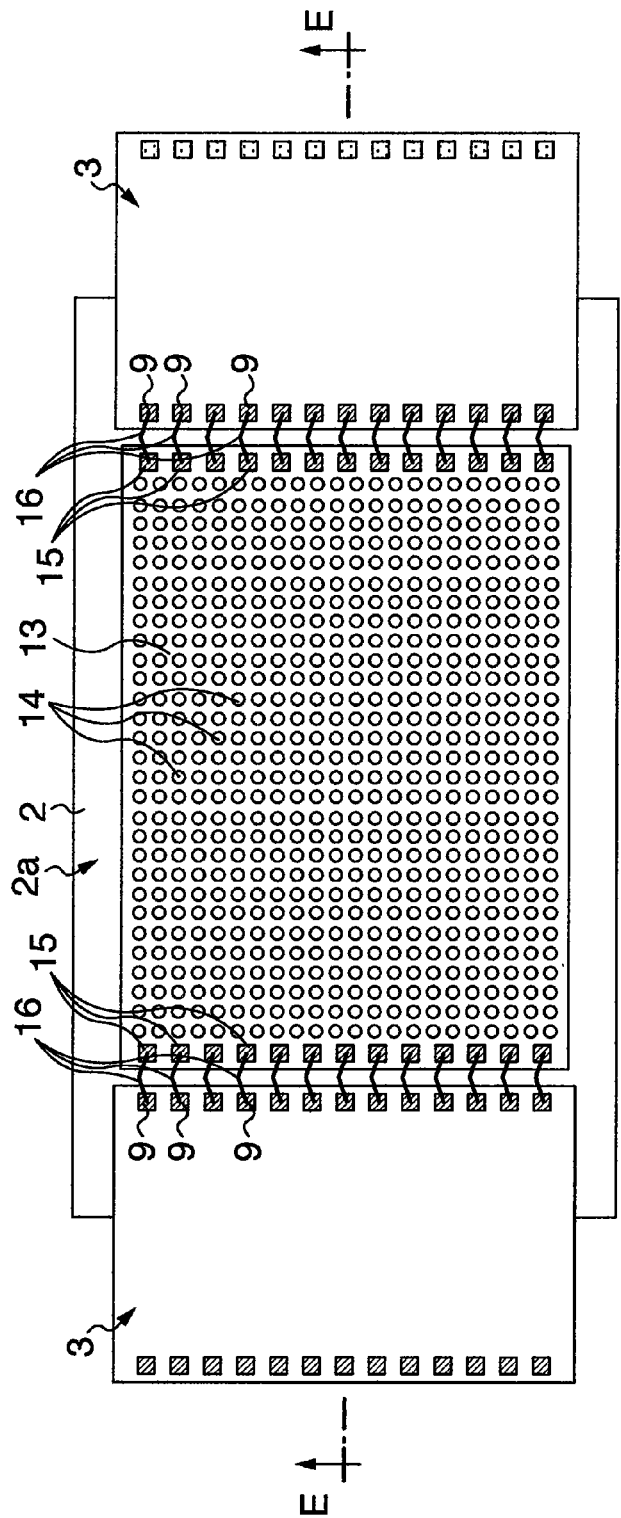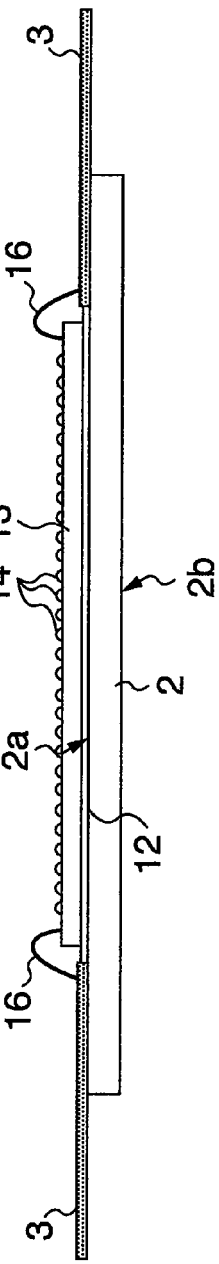

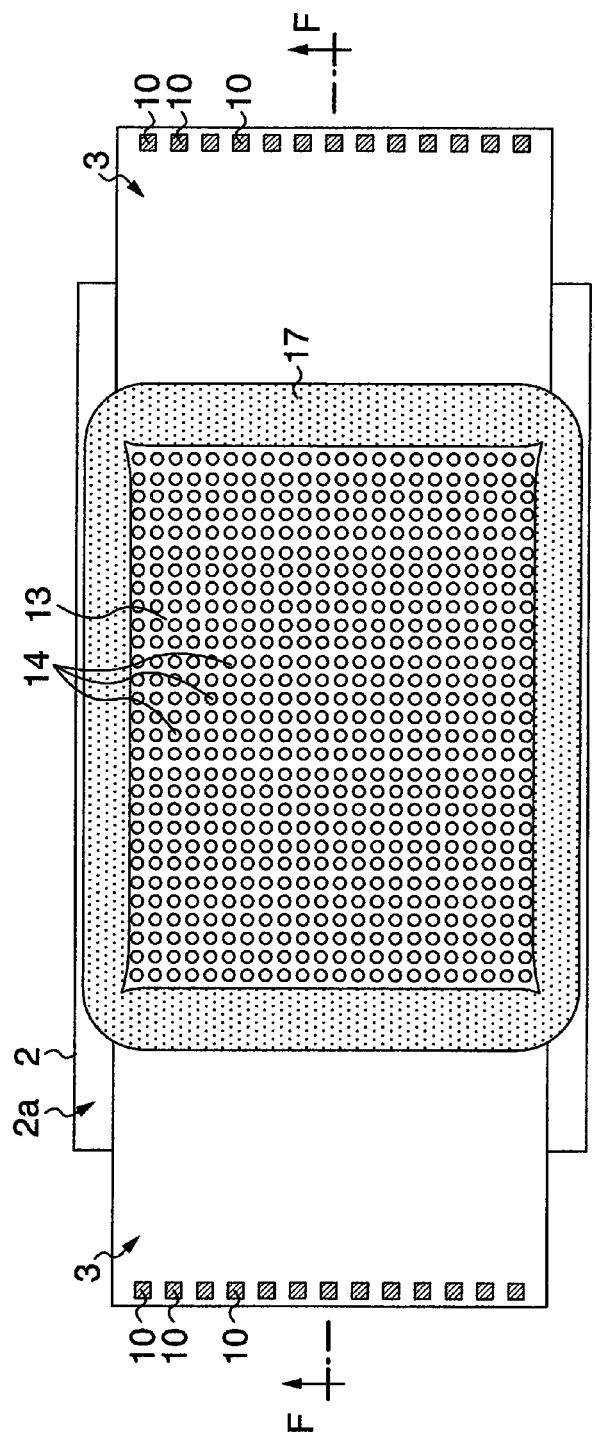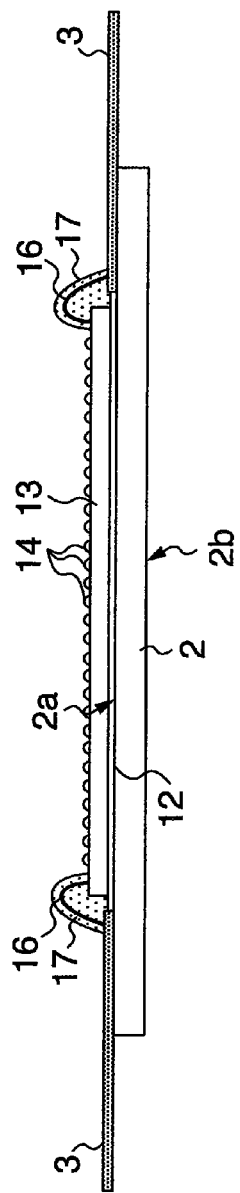

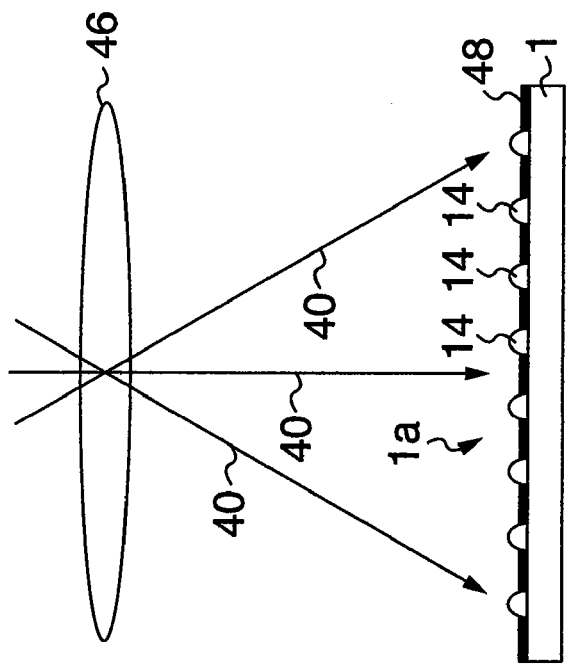
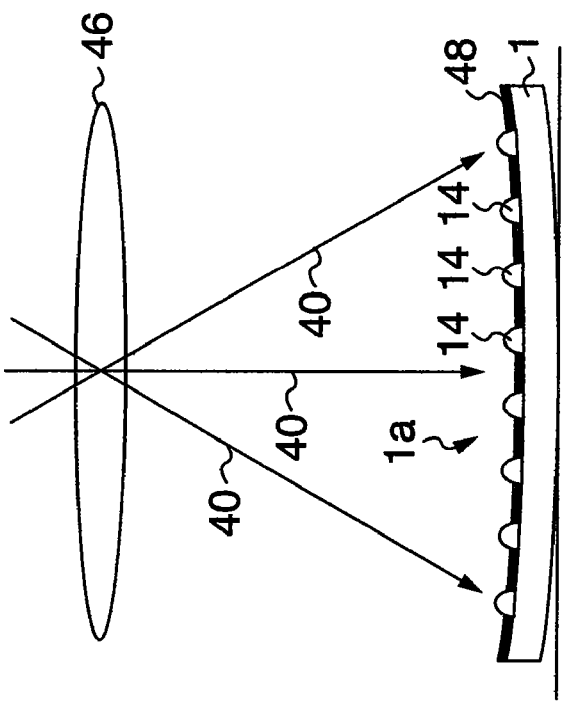

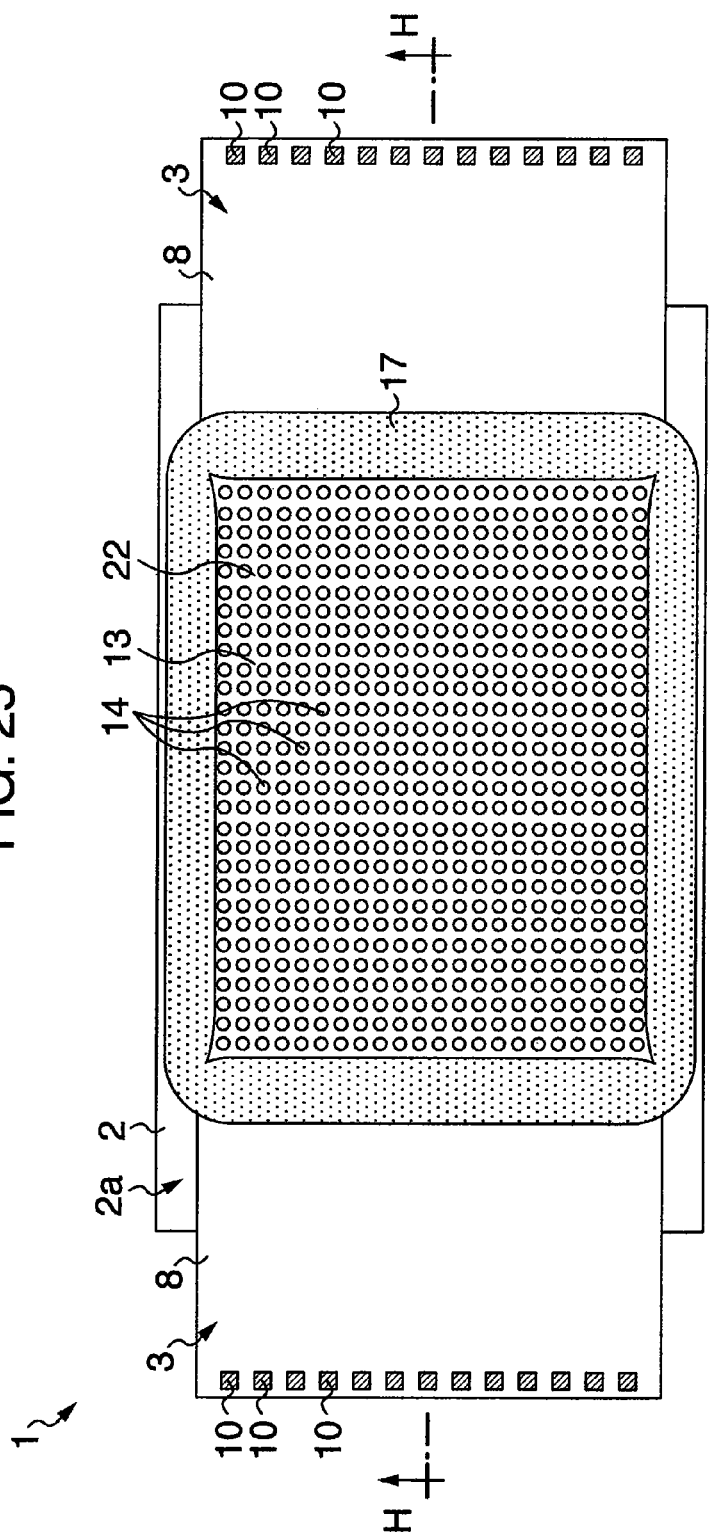
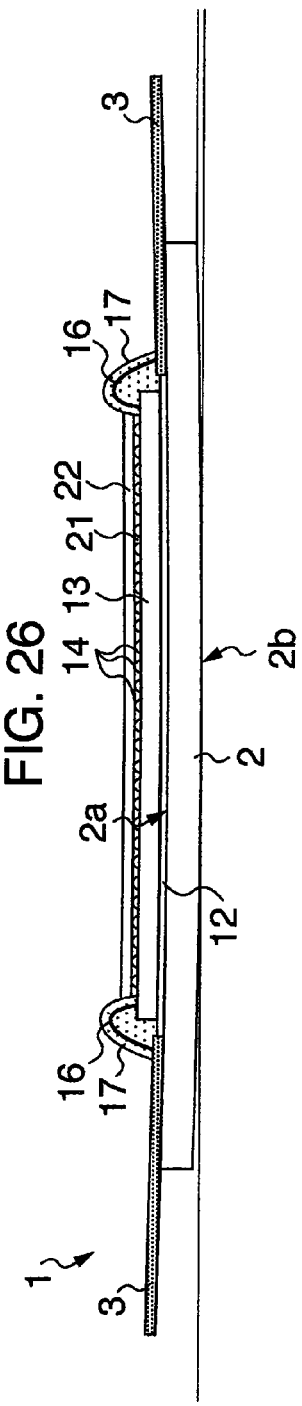

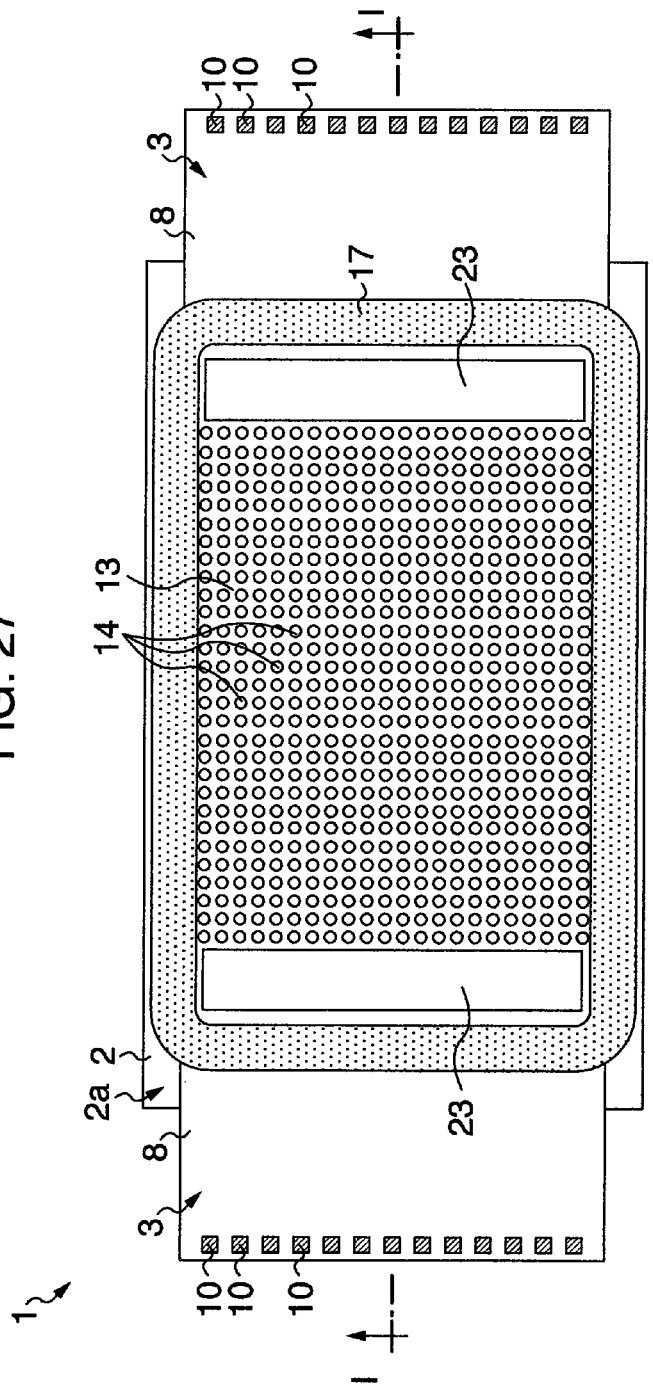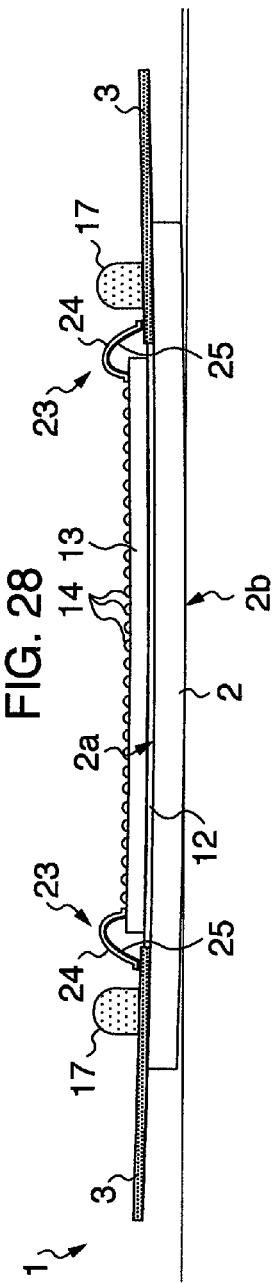

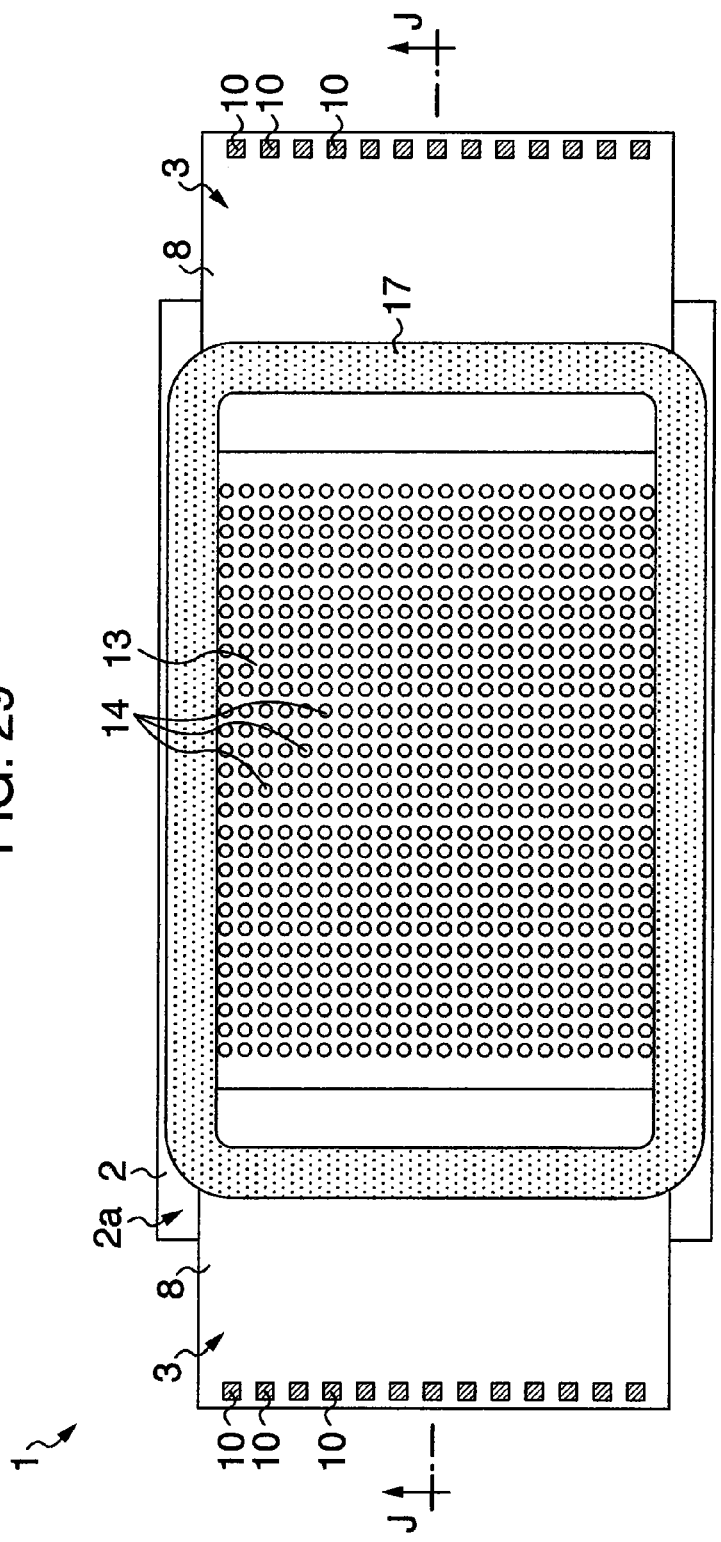
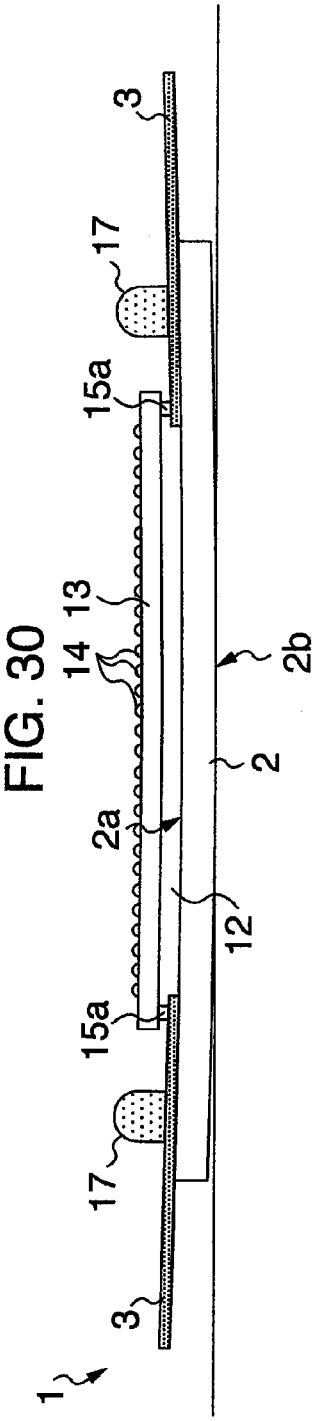

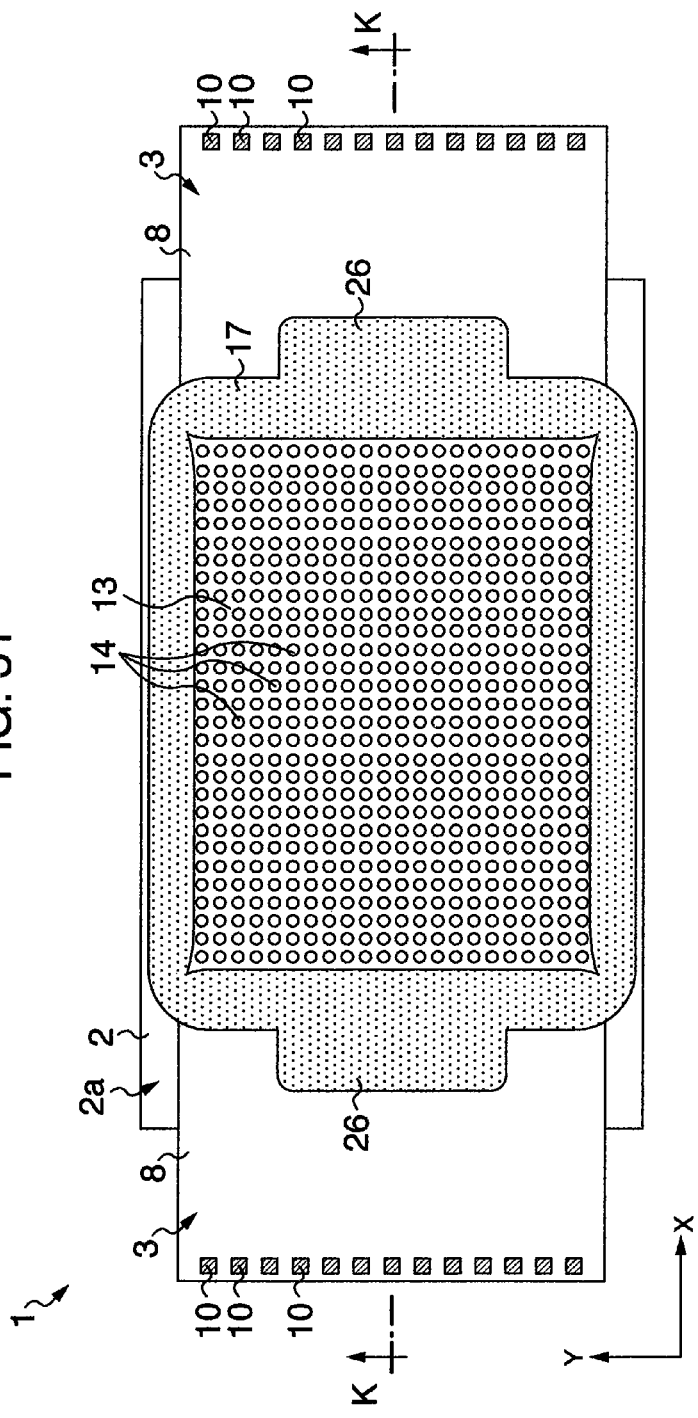

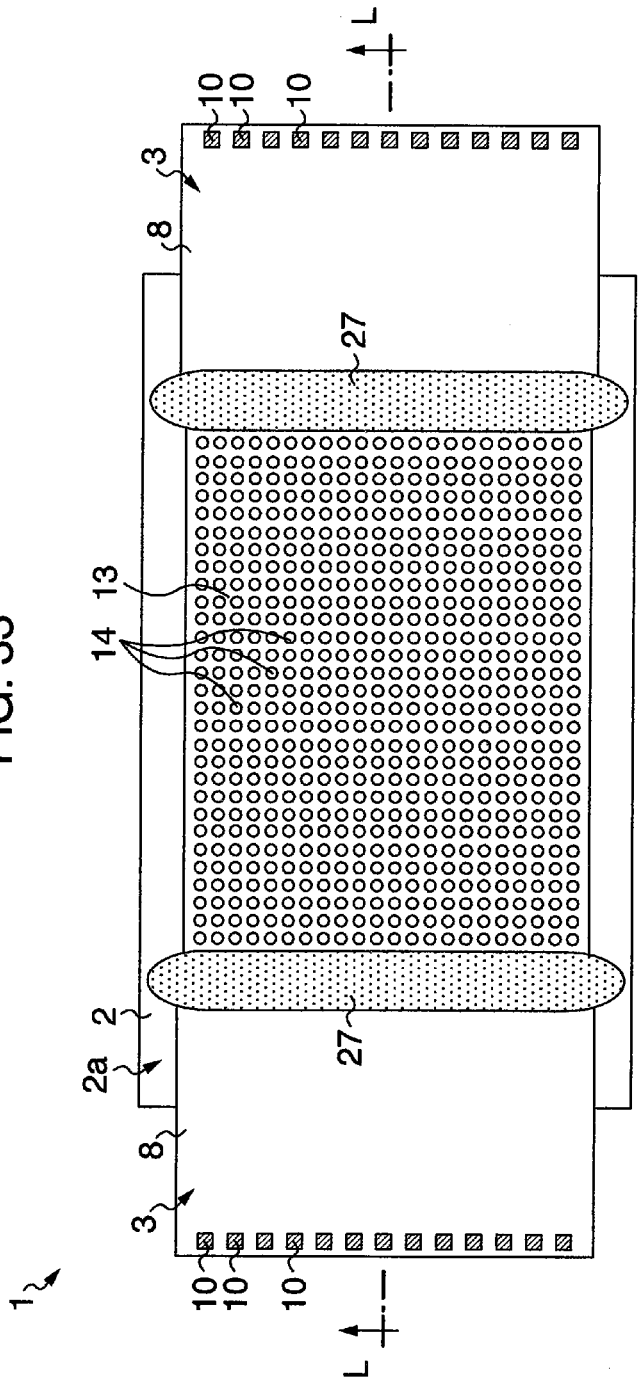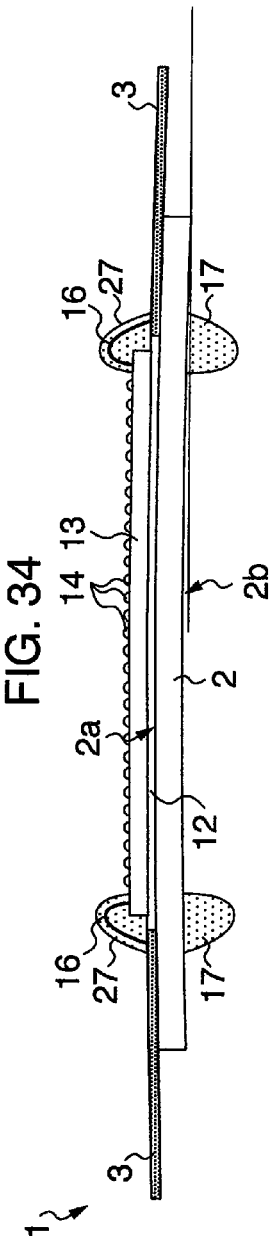

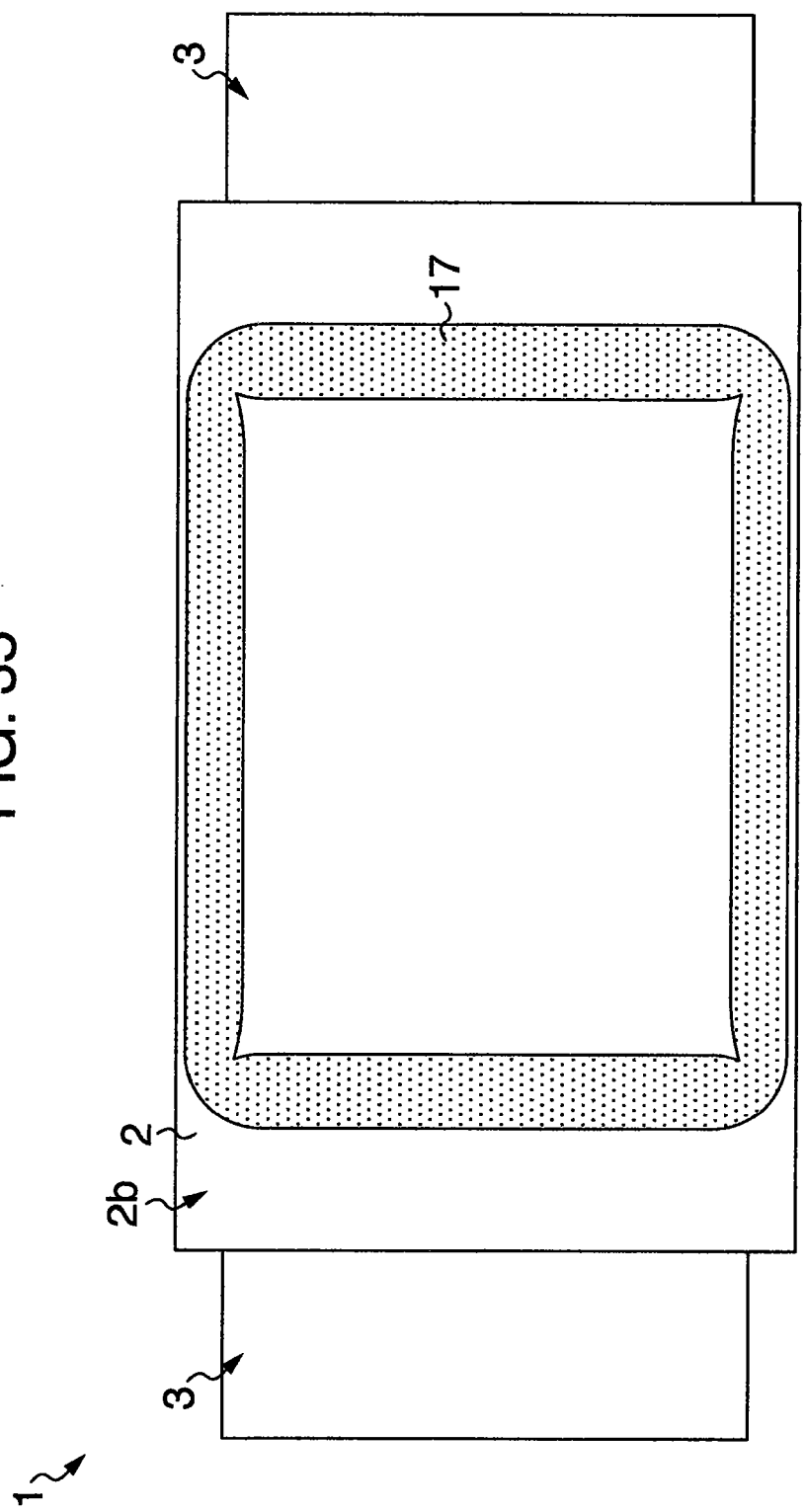

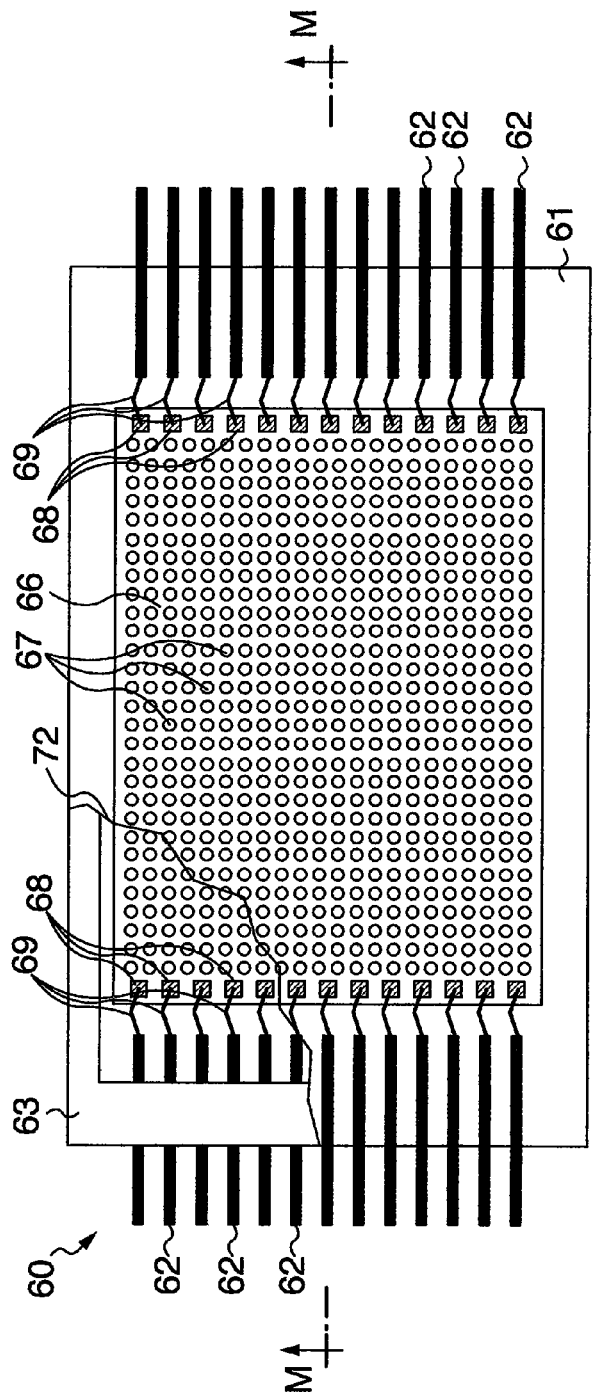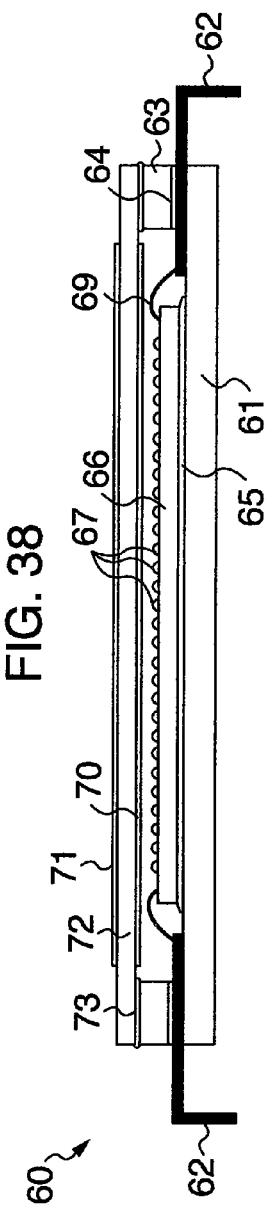

SOLID-STATE IMAGE PICKUP DEVICE AND METHOD OF PRODUCING THE SAME

INCORPORATION BY REFERENCE

The present application claims priorities from Japanese applications JP2006-223958 filed on Aug. 21, 2006 and JP2006-300239 filed on Nov. 6, 2006, the contents of which are hereby incorporated by reference into this application.

BACKGROUND OF THE INVENTION

The present invention relates to a solid-state image pickup device and a method of producing such a device. In particular, the present invention relates to a technique which is effective in application to a technique for producing a solid-state image pickup device using an image sensor such as a CMOS (Complementary Metal Oxide Semiconductor) sensor or a CCD (Charge Coupled Device) sensor.

A solid-state image pickup element (image sensor) such as a CMOS sensor or a CCD sensor is used in optical devices such as digital cameras. Light (a beam) led by an optical lens forms an image on the surface (light receiving face or image pickup face) of a solid-state image pickup element (solid-state image pickup chip). The image is converted to an electric signal by cells (pixels) of the solid-state image pickup element, and taken out as image information.

On the other hand, the distance from a lens (optical lens) becomes long in an image center of the solid-state image pickup element which coincides with an optical axis of the optical lens and in a peripheral part. The so-called curvature of field aberration occurs and the lens is out of focus, resulting in a blurred image and a lowered resolution. As a method for eliminating such curvature of field aberration, a method of curving the light sensing face of the solid-state image pickup element (sensor chip) in a concave form so as to conform with the curvature of field is known (for example, JP-A-10-108078, JP-A-2004-349545 and JP-A-2004-146633).

According to a technique disclosed in JP-A-10-108078, the back of a solid-state image pickup chip is adhered to one face of a flexible elastic plate, and the curvature of the elastic plate is adjusted to adjust the curvature of the light sensing face of the solid-state image pickup chip.

According to a technique disclosed in JP-A-2004-349545, a planar image pickup element (Si having a thermal expansion coefficient of 4 ppm/K) and a planar member (invar having a thermal expansion coefficient of 2 ppm/K) that is different in thermal expansion coefficient from the image pickup element are stacked and bonded to each other in a high temperature state and then cooled to the normal temperature. The light sensing face of the image pickup element is curved to take a concave shape by a difference caused in shrinkage quantity between the image pickup element and the planar member due to the cooling. Thereafter, the image pickup element in the curved state is mounted on a substrate.

According to a method disclosed in JP-A-2004-146633, when joining a solid-state image pickup element to a printed circuit board of a material that is larger in thermal expansion coefficient than a material of the solid-state image pickup element via a projection electrode, the light sensing face of the image pickup element is curved to take a concave shape by a difference caused in thermal expansion coefficient between the printed circuit board and the image pickup element due to the cooling action after the heating and joining.

On the other hand, the conventional solid-state image pickup apparatus typically has a structure incorporating a solid-state image pickup element in a package called cer-DIP (for example, JP-A-2003-243635). A semiconductor device (solid-state image pickup device) disclosed in JP-A-2003-243635 has a structure in which a top opening of a package main body formed of ceramics is sealed with a lid formed of a glass plate. An element disposing region of a bottom part which is an internal bottom of the package main body is curved, and a solid-state image pickup element is stuck fast to and joined to the curved face.

SUMMARY OF THE INVENTION

In optical devices such as digital cameras, solid-state image pickup elements (image sensors) such as CMOS sensors or CCD sensors are used. It is desirable to curve the light sensing face of the sensor chip included in the image sensor so as to take a concave shape in order to eliminate the curvature of field aberration.

As for the method for curving the light sensing face of the sensor chip, mechanical adjustment methods, such as a method of curving the light sensing face of the sensor chip by forcibly joining the sensor chip to a curved face and a method of adjusting the light sensing face of the sensor chip by adjusting the curvature of an elastic plate to which the sensor chip is joined, are known. Furthermore, a method utilizing a thermal expansion coefficient difference of bonding the sensor chip to a support plate that is different in thermal expansion coefficient at high temperatures and then curving the light sensing face of the image pickup element to take a concave face by a difference in shrinkage quantity when restored to the normal temperature is known.

As described in JP-A-2004-349545, in the method of bonding the image pickup element formed of Si (sensor chip) to the platelike member (substrate) formed of invar in the high temperature state, then cooling them to the normal temperature, and curving the light sensing face of the image pickup element to take a concave shape by a difference in thermal expansion coefficient between invar and Si, simulation analysis is conducted on the warp phenomenon. In the simulation, the substrate has a thickness of 0.3 mm, a width of 40.0 mm and a length of 48.0 mm, and the sensor chip has a thickness of 725 μm, a width of 16.0 mm and a length of 24.0 mm. As for the bonding, it is conducted by using die bonding resin (silicone resin having a thermal expansion resin of $2 \times 10^{-4}$/° C.) having a thickness of 50 μm at 150° C. Thereafter, cooling to the normal temperature (20° C.) is conducted.

In the simulation, the warp of the chip can be depicted in a contour line form. When the warp from the center of the chip is depicted in a contour line form, contour lines become elliptical. Denoting the length of the minor axis by "a" of the ellipse and the length of the major axis by "b," a/b is close to 1.0 in desirable transformation. Hereafter, a/b is referred to as aspect ratio.

FIG. 36 is a height difference display example which indicates the warp state of the light sensing face of the sensor chip obtained by simulation analysis. As shown at the rightmost end of FIG. 36, the range of −4 to 2 μm is divided into twenty stages displayed with different circle lines. The warp quantity displayed at this time becomes the sum of absolute values between −4 μm and 2 μm, i.e., approximately 6 μm. (An accurate warp quantity becomes −4.6 μm.) Each of the contour lines takes the shape of an ellipse that is longer in the lengthwise direction. The major axis of the ellipse extends along the Y-axis direction, and the minor axis of the ellipse extends along the X-axis direction.

The smallest elliptical region in the center is a stage including the most depressed part having a depression of −3.85 μm, and it corresponds to the lowest stage in the twenty stages shown at the rightmost end. The contour lines change so as to take similar shapes. The aspect ratio a/b of the warp is 0.78. For obtaining a clear image, it is desirable to set the aspect ratio a/b of the warp equal to a value close to 1.0.

On the other hand, the conventional solid-state image pickup device typically has the cer-DIP structure. FIGS. 37 and 38 show a commercially available solid-state image pickup device having the cer-DIP structure. FIG. 37 is a schematic plan view obtained by cutting off a part of a solid-state image pickup device 60. FIG. 38 is a sectional view taken along a line M-M shown in FIG. 37.

The solid-state image pickup device 60 includes a rectangular alumina substrate 61. A plurality of leads 62 are fixed in parallel along long sides on each of short sides of a top face of the alumina substrate 61. These leads 62 are bent downward on the outside of the alumina substrate 61 to form in-line leads. A frame 63 for the alumina substrate including rectangular parts is bonded to outskirts of the top face of the alumina substrate 61 via an insulative bonding agent 64. This results in a structure in which the leads 62 are sandwiched between the alumina substrate 61 and the frame 63. In other words, the package main body including the alumina substrate 61 and the frame 63 has a depressed structure.

On the other hand, a sensor chip 66 including a CMOS sensor is fixed to the top face of the alumina substrate 61 located inside the frame 63 via an insulative bonding agent 65. Microlenses 67 are aligned and arranged on the top face of the sensor chip 66 lengthwise and breadthwise to guide light to respective cells (pixels) of the sensor chip 66. Electrodes 68 are provided on the short sides of the top face of the sensor chip 66. The electrodes 68 are electrically connected to internal end parts of the corresponding leads 62 via conductive wires 69.

A glass plate 72 (lid) having reflection prevention films 70 and 71 on its obverse and reverse is hermetically fixed (sealed) to the top face of the frame 63 via a bonding agent 73.

Dimensions of commercially available solid-state image pickup devices are, for example, as follows: the package exclusive of the lead part has a width of approximately 26.0 mm, a length of approximately 38.0 mm and a height (thickness) of approximately 3.0 mm (which is the thickness of the substrate to glass thickness).

The solid-state image pickup device 60 having such a cer-DIP structure has a structure in which the glass plate 72 is disposed over the sensor chip 66. Since there is a gap of approximately 0.5 mm between the sensor chip 66 and the glass plate 72, the solid-state image pickup device 60 becomes thick. Furthermore, since it is necessary in the cer-DIP structure to dispose the frame on the top face of the substrate, the weight also becomes heavy.

An object of the present invention is to provide a solid-state image pickup device capable of eliminating the curvature of field aberration and a method for producing the device.

Another object of the present invention is to provide a solid-state image pickup device which can be made thin in size and light in weight and a method for producing the device.

These and other objects and novel features of the present invention will be made clear by the description in the present specification and accompanying drawings.

Representative aspects of the present invention will now be described briefly.

(1) The present invention provides a solid-state image pickup device including: a substrate having a first face and a second face which serves as an opposite face of the first face; a solid-state image pickup element having a plurality of electrodes and having a light sensing part on a first face thereof, a second face of the solid-state image pickup element serving as an opposite face of the first face being bonded to the first face of the substrate via a bonding agent; a plurality of wires formed over the face of the substrate, first ends of the wires serving as external electrode terminals; and connection means for electrically connecting the electrodes of the solid-state image pickup element to the wires, respectively, wherein a contraction frame formed of resin that is larger in thermal expansion coefficient than the substrate and the solid-state image pickup element is bonded to and formed on a surface side of the substrate located outside the light sensing part of the solid-state image pickup element so as to surround the light sensing part, and a light sensing face of the light sensing part of the solid-state image pickup element is warped.

The contraction frame is formed over the face of the substrate, and the light sensing face of the solid-state image pickup element is warped so as to take a concave shape. The concave warp forms a face that is approximate to the curvature of field of a lens optically connected to the solid-state image pickup element. Furthermore, the thermal expansion coefficient of the material that forms the solid-state image pickup element has the same numerical value as the thermal expansion coefficient of the material that forms the substrate. In other words, the solid-state image pickup element is formed of silicon having a thermal expansion coefficient of approximately 3 ppm/° C., and the substrate is formed of silicon nitride having a thermal conductivity of 90 W/m·K and a thermal expansion coefficient of approximately 3 ppm/° C. which is close to the thermal expansion coefficient of silicon. The contraction frame is formed of epoxy resin having a thermal expansion coefficient of approximately 11 ppm/° C. The electrodes of the solid-state image pickup element are connected to the wires via conductive wires, respectively, and the wires are buried in the contraction frame. The wires are formed by bonding flexible printed circuit boards each including insulative tape and a plurality of wires provided on one face of the tape to the first face of the substrate.

Such a solid-state image pickup device is produced by:

(a) a process of preparing a substrate having a first face and a second face which serves as an opposite face of the first face, having a solid-state image fixing part on the first face, and having a plurality of wires electrically connected to electrodes of the solid-state image pickup element over the first face;

(b) a process of preparing the solid-state image pickup element having a plurality of electrodes, having a light sensing part on a first face, and having a second face serving as an opposite face of the first face;

(c) a process of fixing the solid-state image pickup element to the solid-state image pickup element fixing part so as to oppose the second face of the solid-state image pickup element to the first face of the substrate and electrically connecting the electrodes of the solid-state image pickup element respectively to the wires via connection means; and (d) a process of bonding and forming a contraction frame to and on a surface side of the substrate located outside the light sensing part of the solid-state image pickup element so as to surround the light sensing part at a temperature higher than a normal temperature by using resin that is larger in thermal expansion coefficient than the substrate and the solid-state image pickup element, then cooling the whole to the normal temperature, and warping a light sensing face of the light sensing part of the solid-state image pickup element by contraction of the contraction frame.

In the process (a), the wires are formed by bonding flexible printed circuit boards each including insulative tape and a plurality of wires provided on one face of the tape to the first face of the substrate. At this time, the substrate formed of silicon nitride having a thermal expansion coefficient of approximately 3 ppm/° C. is prepared.

In the process (b), the solid-state image pickup element formed of silicon having a thermal expansion coefficient of approximately 3 ppm/° C. is prepared.

In the process (c), the second face of the solid-state image pickup element is fixed to the first face of the substrate via a bonding agent, and then the electrodes of the solid-state image pickup element are connected to the wires via conductive wires, respectively.

In the process (d), the light sensing face of the solid-state image pickup element is warped so as to take a concave shape by forming the contraction frame over the first face of the substrate by using epoxy resin having a thermal expansion coefficient of approximately 11 ppm/° C. at a temperature of one hundred and several tens (for example, 150° C.) and then cooling the contraction frame to the normal temperature (20° C.). At this time, the contraction frame is formed so as to cover the wires.

(2) In the means (1), the contraction frame is formed so as to take a shape projected to outside of the contraction frame in a partial region thereof.

In the process (d) in the method for producing such a solid-state image pickup device (1), the contraction frame is formed so as to take a shape projected to outside of the contraction frame in a partial region thereof.

(3) In the means (1), a transparent protection substance is bonded to the whole area of the light sensing face of the solid-state image pickup element via a transparent bonding agent.

The method for producing such a solid-state image pickup device (1) includes, after the process (d), (e) a process of bonding a transparent protection substance to the whole area of the light sensing face of the solid-state image pickup element via a transparent bonding agent.

Hereafter, effects brought about by representative aspects of the present invention will be described briefly.

According to the means (1), (a) the solid-state image pickup element having a thermal expansion coefficient of approximately 3.0 ppm/° C. is bonded to the substrate having a thermal expansion coefficient of approximately 3.0 ppm/° C. In addition, the contraction frame is formed of epoxy resin having a thermal expansion coefficient of 11 ppm/° C. over the first face of the substrate so as to surround the solid-state image pickup element. The bonding and the heat treatment (curing) of the contraction frame are conducted at a temperature of 150° C. Thereafter, the whole (including the substrate, the solid-state image pickup element and the contraction frame) is cooled to the normal temperature (20° C.). The contraction frame has a thermal expansion coefficient that is approximately four times as large as that of the substrate and the solid-state image pickup element. At the normal temperature, therefore, the contraction frame generates stress so as to wring the substrate and the solid-state image pickup element. As a result, the light sensing face of the solid-state image pickup element is warped so as to take a concave shape. The contraction frame which generates the warp varies diversely depending upon the sectional area, i.e., the width, height and formed shape of the contraction frame. Therefore, the warp can be made approximately equal to the curvature of field of the optical system including the lens that guides light (beam) to the light sensing face of the solid-state image pickup device, by selecting the dimensions.

(b) Each of the substrate and the solid-state image pickup element is warped so as to take a concave shape by contraction of the contraction frame. Therefore, curvatures of warps along the long side and the short side of the solid-state image pickup element can be adjusted by selecting the width, height and formed shape of the contraction frame. As a result, warp of the light sensing face of the solid-state image pickup element can be made to coincide with or be approximate to the curvature of field. In the conventional technique of warping the light sensing face of the solid-state image pickup element by bonding and curing the substrate and the solid-state image pickup element that are different from each other in thermal expansion coefficient, at a high temperature and then cooling them to the normal temperature, the degree of the warp depends upon dimensions of the solid-state image pickup element and the substrate stuck to each other and becomes constant. In other words, the warp cannot be adjusted in the conventional sticking method. According to the present invention, however, the degree of warp in each direction of the light sensing face of the solid-state image pickup element can be adjusted by selecting the shape of the contraction frame and dimensions of the contraction frame.

(c) The warp of the light sensing face of the solid-state image pickup element is formed according to the method described in (b). If the solid-state image pickup device is incorporated into a camera or the like, the so-called tilting phenomenon, in which light from an optical axis of the lenses does not become perpendicular to the light sensing face of the solid-state image pickup element but is tilted, becomes inapt to occur in assembling the solid-state image pickup element to lenses of the camera. This facilitates the tilting correction work when the solid-state image pickup device according to the present invention is used in an optical device such as a camera, i.e., tilting correction work of correcting the position and angle so as to make the light from the lens optical axis perpendicular to the light sensing face of the solid-state image pickup element.

(d) As described in (b), the warp of the light sensing face of the solid-state image pickup element can be made to coincide with or be approximate to the curvature of field. When the solid-state image pickup device is used in an optical device, therefore, it is possible to improve the image forming performance in conjunction with the optical system including lenses.

(e) As described in (b), the warp of the light sensing face of the solid-state image pickup element can be made to coincide with or be approximate to the curvature of field. When the solid-state image pickup device is used in an optical device, therefore, correction for the lens curvature of field becomes unnecessary. In this case, it becomes possible to reduce the number of lenses included in the optical system, because the correction for the lens curvature of field becomes unnecessary.

(f) Since the solid-state image pickup element is bonded to the substrate formed of silicon nitride having a favorable thermal conduction property (having a thermal conductivity of 90 W/m·K), heat generated in the solid-state image pickup element can be radiated to the outside via the substrate quickly. When the solid-state image pickup device is used in a camera, therefore, exposure to light for a long time becomes possible. For example, it is also possible to take an image of a night view beautifully by conducting exposure to light for a long time.

(g) As described in (b), the warp of the light sensing face of the solid-state image pickup element can be made to coincide with or be approximate to the curvature of field. As for the light receiving quantity in the image peripheral part as well, the same light quantity as that in the image center part can be taken in, and a clear image can be obtained. In the color video image, therefore, it becomes possible to unify the color density in the image center and in the image peripheral part.

(h) The solid-state image pickup device has a structure in which the solid-state image pickup element is bonded to the first face of the substrate and the contraction frame is provided so as to surround the solid-state image pickup element. In the solid-state image pickup device according to the present invention, therefore, it is not necessary to provide the package main body with a depressed structure and the lid is not needed, unlike the conventional cer-DIP structure. This brings about an effect that thin light-weight products are obtained. In addition, the production cost of the solid-state image pickup device can also be reduced owing to reduction of the number of components.

According to the means described in (2), the following effect is brought about in addition to effects brought about by the means described in (1). In a partial region of the contraction frame, the contraction frame is projected to the outside. As a result, contraction force obtained when the projected part is cooled increases the contraction force applied to the substrate and the solid-state image pickup element along the projection direction. Thus, it becomes possible to adjust the degree of the warp.

According to the means described in (3), the following effect is brought about in addition to effects brought about by the means described in (1). A transparent protection substance is bonded to the whole area of the light sensing face of the solid-state image pickup element via a transparent bonding agent. Thus, it becomes possible to protect the light sensing face of the solid-state image pickup element by using the protection substance, resulting in improved reliability of the solid-state image pickup element.

Other objects, features and advantages of the invention will become apparent from the following description of the embodiments of the invention taken in conjunction with the accompanying drawings.

BRIEF DESCRIPTION OF THE DRAWINGS

FIG. 1 is a schematic plan view of a solid-state image pickup device according to a first embodiment of the present invention;

FIG. 2 is a sectional view taken along a line A-A shown in FIG. 1;

FIG. 5 is a schematic plan view of printed circuit boards with substrate used in the production method of the solid-state image pickup device according to the first embodiment;

FIG. 6 is a sectional view taken along a line B-B shown in FIG. 5;

FIG. 7 is a schematic plan view showing a state in which die bonding resin is applied to the printed circuit boards with substrate;

FIG. 8 is a schematic plan view showing a state in which a sensor chip is fixed to the printed circuit boards with substrate;

FIG. 9 is a sectional view taken along a line D-D shown in FIG. 8;

FIG. 10 is a schematic plan view showing a state in which a printed circuit on the printed circuit boards with substrate is connected to electrodes of the sensor chip via wires;

FIG. 11 is a sectional view taken along a line E-E shown in FIG. 10;

FIG. 12 is a schematic plan view showing a state in which a contraction frame is formed on the substrate;

FIG. 13 is a sectional view taken along a line F-F shown in FIG. 12;

FIGS. 23A and 23B are schematic diagrams showing a state of light passed through a camera lens incident on the light sensing face of the solid-state image pickup device according to the first embodiment and a state of light passed through the camera lens incident on the solid-state image pickup device having a planar light sensing face;

FIG. 25 is a schematic plan view of a solid-state image pickup device according to a second embodiment;

FIG. 26 is a sectional view taken along a line H-H shown in FIG. 25;

FIG. 27 is a schematic plan view of a solid-state image pickup device according to a third embodiment;

FIG. 28 is a sectional view taken along a line I-I shown in FIG. 27;

FIG. 29 is a schematic plan view of a solid-state image pickup device according to a fourth embodiment;

FIG. 30 is a sectional view taken along a line J-J shown in FIG. 29;

FIG. 31 is a schematic plan view of a solid-state image pickup device according to a fifth embodiment;

FIG. 32 is a sectional view taken along a line K-K shown in FIG. 31;

FIG. 33 is a schematic plan view of a solid-state image pickup device according to a sixth embodiment;

FIG. 34 is a sectional view taken along a line L-L shown in FIG. 33;

FIG. 35 is a bottom view of the solid-state image pickup device according to the sixth embodiment;

FIG. 37 is a plan view showing a conventional solid-state image pickup device with a part thereof cut off;

FIG. 38 is a sectional view taken along a line M-M shown in FIG. 37; and

DETAILED DESCRIPTION OF THE INVENTION

Figure 3:
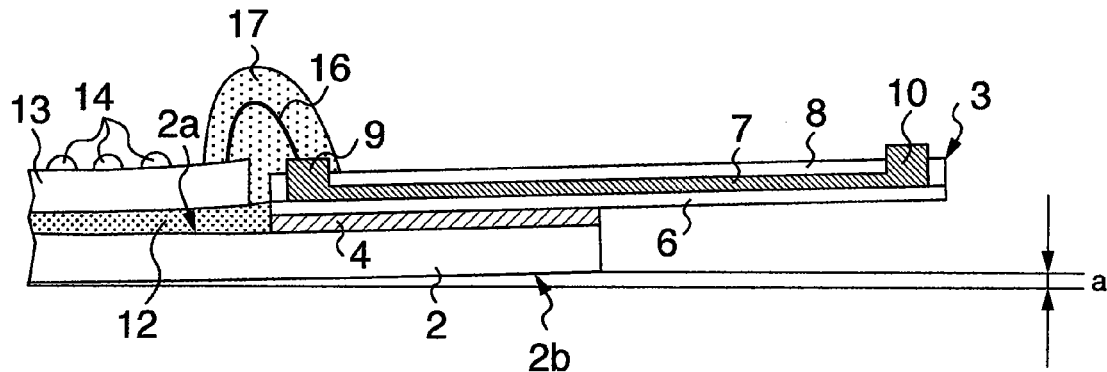
FIG. 3 is an enlarged sectional view showing a part of FIG. 2.

Hereafter, embodiments of the present invention will be described in detail with reference to the drawings. Throughout all diagrams for describing the embodiments of the present invention, components having the same function are denoted by like reference numerals and repeated description thereof will be omitted.

FIRST EMBODIMENT

FIGS. 1 to 13 are diagrams relating to a solid-state image pickup device according to a first embodiment of the present invention and a method for producing the device. FIGS. 4 to 13 are diagrams relating to the production method of the solid-state image pickup device.

As shown in FIGS. 1 and 2, a solid-state image pickup device 1 according to the first embodiment includes a rectangular substrate 2. The substrate 2 is a substrate with printed circuit boards, and has a structure in which flexible printed circuit boards (FPC) 3 are bonded to short sides of a first face 2a of the substrate 2 via a bonding agent 4 (see FIG. 3). The flexible printed circuit boards 3 are fixed to the substrate 2 so as to make the middle of width of the flexible printed circuit boards 3 coincide with the middle of width of the substrate 2. FIG. 3 is a diagram which shows the structure in more detail by enlarging the right end part of FIG. 2. As shown in FIG. 3, each of the flexible printed circuit boards 3 includes insulative tape 6, a plurality of wires provided on one face (a first face) of the tape 6, and an insulative film 8 which selectively covers the wires 7. A second face of the tape 6 which is a face opposite to the first face is bonded to the substrate 2 by the insulative bonding agent 4. As shown in FIG. 3, the flexible printed circuit board 3 has a structure that exposes end parts of the wires 7 from the first face (see FIG. 5). As shown in FIG. 5, the flexible printed circuit board 3 is bonded so as to be projected at one end thereof from an end of the substrate 2 by a predetermined length. Wiring parts arranged on the inside end of the flexible printed circuit board 3 where the flexible printed circuit board 3 overlaps the substrate 2 constitute electrode pads 9 for connection to wires which serve as connection means. Wiring parts arranged on the outside ends where the flexible printed circuit board projects from the substrate 2 constitute external electrode terminals 10 of the solid-state image pickup device 1.

On the other hand, a rectangular solid-state image pickup element 13 is fixed to the first face 2a of the substrate 2 interposed between the pair of flexible printed circuit boards 3, via an insulative bonding agent 12. The solid-state image pickup element 13 is formed of, for example, a CMOS sensor. Microlenses 14 are aligned and arranged on a light sensing face (image pickup face) which is a first face of the solid-state image pickup element 13 lengthwise and breadthwise (see FIGS. 1 and 2). Although not illustrated, a sensor part (CMOS sensor cells) is provided right under the microlenses 14. A second face of the solid-state image pickup element 13 which is an opposite face of the first face is bonded to the first face 2a of the substrate 2 by the bonding agent 12. As shown in FIG. 8, a plurality of electrodes 15 are provided at both ends on the first face of the solid-state image pickup element 13. These electrodes 15 form a line along each of short sides in parallel to the electrode pads 9. The electrodes 15 are electrically connected to corresponding electrode pads 9 by conductive wires 16 (see FIG. 10). The wires 16 are covered by a contraction frame 17 formed of insulative resin. As shown in FIGS. 1 and 2, the contraction frame 17 is provided so as to surround the solid-state image pickup element 13. In other words, the contraction frame 17 is provided along long sides and short sides of the solid-state image pickup element 13.

The solid-state image pickup device 1 has a structure in which the first face of the substrate 2 and the first face of the solid-state image pickup element 13 are warped so as to take a concave shape (with a warp dimension "a") by contraction caused when the contraction frame 17 is formed. For example, the substrate 2 is formed of a silicon nitride plate (having a thermal expansion coefficient of 3 ppm/° C.) that is 37.0 mm in width, 38.0 mm in length and 0.35 mm in thickness. The flexible printed circuit board 3 is formed of a polyimide resin printed circuit board having a width of 26.0 mm, a length of 12.28 mm and a thickness of 0.05 mm. The solid-state image pickup element 13 is formed of silicon (having a thermal expansion coefficient of 3 ppm/° C.) that is 17.44 mm in width, 24.64 mm in length and 0.725 mm in thickness. In other words, in the embodiment, the substrate 2 and the solid-state image pickup element 13 that are nearly equal in thermal expansion coefficient are used. In the bonding agent 12 which fixes the solid-state image pickup element 13 to the substrate 2, little warp is generated because of the structure in which the bonding agent 12 is located between the substrate 2 and the solid-state image pickup element 13 that are nearly equal in thermal expansion coefficient. The bonding agent 4 which fixes the flexible printed circuit board 3 to the substrate 2 is an epoxy resin bonding agent. Since the bonding agent 4 is as thin as approximately 50 μm, it does not function as such a strength member as to warp the substrate 2 and the solid-state image pickup element 13.

The contraction frame 17 is depicted as if it is constricted thinly at corners of the rectangular frame in, for example, FIG. 1. As a matter of fact, however, the contraction frame has widths equal to those at the side parts, at the corners. For example, the contraction frame 17 has a section like a gentle mountain which is approximately 5.0 mm in width and approximately 1.0 mm in height. Epoxy resin having a thermal expansion coefficient of approximately 11 ppm/° C. is used as the contraction frame 17. The contraction frame 17 is formed by applying resin and conducting curing using heat treatment. This formation is conducted at a high temperature of, for example, 150° C. After the curing, the contraction frame 17 is cooled to the normal temperature (20° C.). The thermal expansion coefficient of the contraction frame 17 which is approximately 11 ppm/° C. is approximately a little more than four times as large as the thermal expansion coefficient of the substrate 2 and the solid-state image pickup element 13 which is approximately 3 ppm/° C. When the contraction frame 17 is cooled, therefore, the first face 2a of the substrate 2 and the first face of the solid-state image pickup element 13 are warped so as to take a concave shape by contraction force of the rectangular contraction frame 17. The warp takes dimensions similar to the curvature of field.

Figure 4:
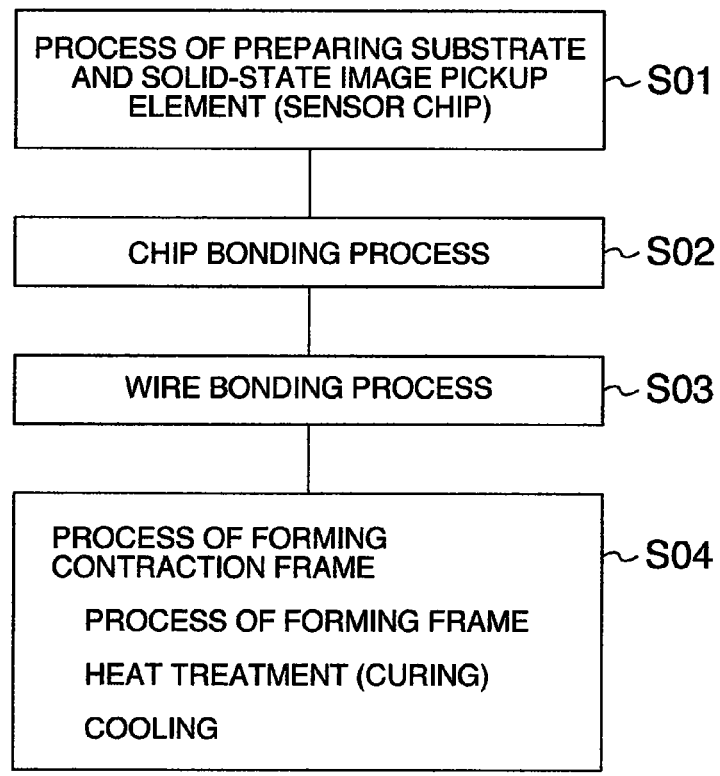
FIG. 4 is a flow chart showing a production method of the solid-state image pickup device according to the first embodiment.

A method for producing the solid-state image pickup apparatus 1 will now be described with reference to FIGS. 4 to 13. FIG. 4 is a flow chart showing the method for producing the solid-state image pickup apparatus 1. The solid-state image pickup apparatus 1 is produced via "process of preparing substrate and solid-state image pickup element (sensor chip)" (S01), "chip bonding process" (S02), "wire bonding process" (S03), and "process of forming contraction frame" (S04). In the "process of forming contraction frame" (S04), "process of forming frame", "heat treatment (curing)" and "cooling" are conducted in the cited order.

In the production of the solid-state image pickup device 1, the substrate 2 with the flexible printed circuit board 3 attached thereto and the solid-state image pickup element 13 are first prepared (S01). FIG. 5 is a schematic plan view of the printed circuit boards with substrate used in the method for producing the solid-state image pickup device according to the first embodiment. FIG. 6 is a sectional view taken along a line B-B shown in FIG. 5. For example, the substrate 2 is formed of a silicon nitride plate (having a thermal expansion coefficient of 3 ppm/° C.) that is 37.0 mm in width, 38.0 mm in length and 0.35 mm in thickness. The flexible printed circuit boards 3 are bonded to both end sides of the first face 2a of the substrate 2. Each of the flexible printed circuit board 3 is formed of a polyimide resin printed circuit board having a width of 26.0 mm, a length of 12.28 mm and a thickness of 0.05 mm. A region of the first face 2a of the substrate 2 located between the pair of flexible printed circuit boards functions as a solid-state image pickup element fixing part 18. The solid-state image pickup element fixing part 18 becomes the exposed first face 2a of the substrate 2. Since the structure of the flexible printed circuit board 3 has already been described, its description will be omitted.

Subsequently, the bonding agent 12 is thinly applied to the solid-state image pickup element fixing part 18 on the first face 2a of the substrate 2 as shown in FIG. 7.

Subsequently, the solid-state image pickup element 13 is positioned and fixed on the solid-state image pickup element fixing part 18 of the first face 2a of the substrate 2 via the bonding agent 12 as shown in FIGS. 8 and 9. At this time, the second face of the solid-state image pickup element 13 is fixed to the substrate 2 by the bonding agent 12. As a result, the microlenses 14 appear on the surface of the solid-state image pickup element 13 in a state in which the microlenses 14 are arranged to be aligned. The electrodes 15 are provided at both ends on the first face of the solid-state image pickup element 13. The electrodes 15 disposed in a line along each of the left and right ends of the solid-state image pickup element 13 are parallel to the electrode pads 9. The solid-state image pickup element 13 is formed of silicon (having a thermal expansion coefficient of 3 ppm/° C.) that is 17.44 mm in width, 24.64 mm in length and 0.725 mm in thickness. The heat treatment (curing) of the bonding agent 12 which fixes the solid-state image pickup element 13 to the substrate 2 is conducted at a temperature of 150° C. for 30 minutes. Little warp of the substrate 2 and the solid-state image pickup element 13 is generated by heat in the heat treatment.

Subsequently, the electrodes 15 of the solid-state image pickup element 13 are electrically connected to corresponding electrode pads 9 on the flexible printed circuit board 3 via conductive wires 16 as shown in FIGS. 10 and 11 by using the ordinary wire bonding equipment.

Subsequently, the contraction frame 17 is formed over the face 2a of the substrate 2 as shown in FIGS. 12 and 13. In the formation of the contraction frame 17, epoxy resin having a thermal expansion coefficient of 11 ppm/° C. is applied along edges of the solid-state image pickup element 13 so as to surround the solid-state image pickup element 13 to form the frame. Since the wires 16 are connected to both end parts of the solid-state image pickup element 13, the wires 16, the electrode pads 9 and the electrodes 15 are covered by the frame. The frame takes, in section, a raised shape having, for example, approximately 1.0 mm in height and approximately 5.0 mm in width. The application of resin is conducted by, for example, application using a dispenser or screen printing.

Subsequently, the frame (resin) formed by the application is subject to heat treatment and curing to form the contraction frame 17. The heat treatment is conducted at a temperature of one hundred and several tens.

Subsequently, the whole inclusive of the contraction frame 17 is cooled to the normal temperature (20° C.). In an atmosphere at 150° C. at the time of the heat treatment before cooling, the substrate 2, the solid-state image pickup element 13 and the contraction frame 17 maintain a flat state without warping as shown in FIG. 13. After the cooling, however, each of the first face 2a of the substrate 2 and the light sensing face of the solid-state image pickup element 13 is warped to take a concave shape as shown in FIG. 2. A warp quantity "a" is shown in FIG. 2.

A result of a mechanism analysis (simulation) concerning warp occurrence conducted before the production of the solid-state image pickup device 1 according to the first embodiment will now be described.

Figure 14:
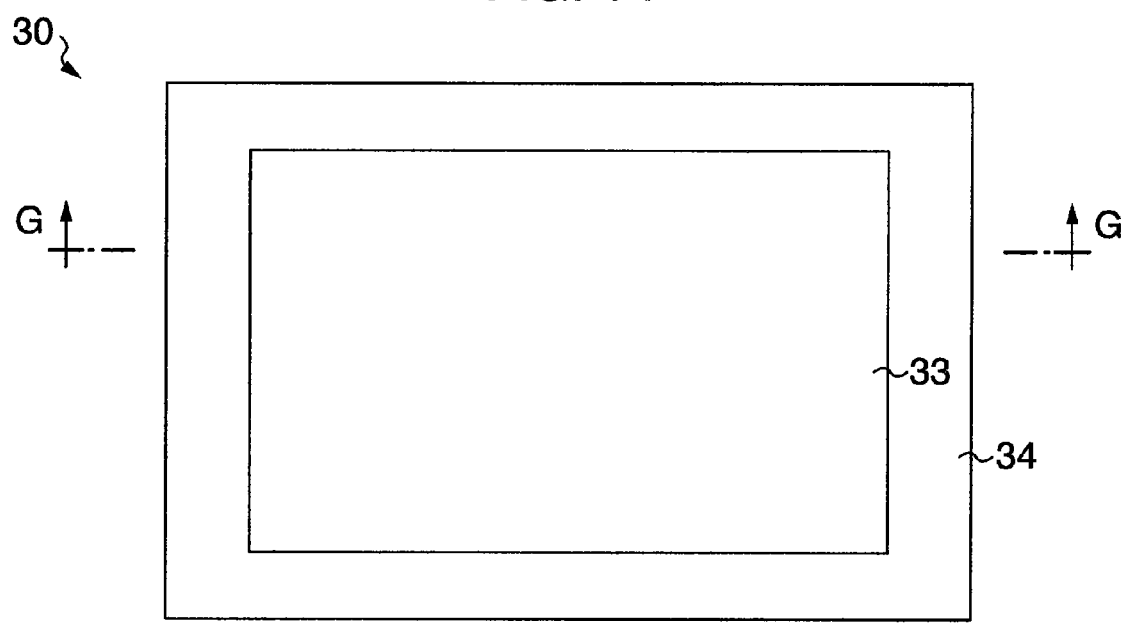
FIG. 14 is a plan view of a simulation model.
Figure 15:
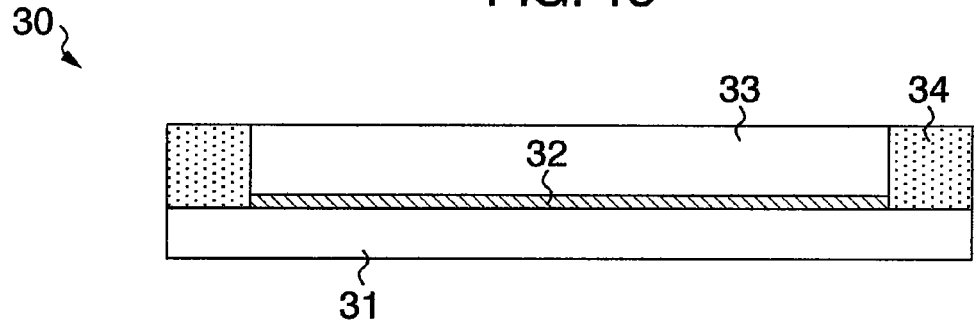
FIG. 15 is a sectional view taken along a line G-G shown in FIG. 14.

FIGS. 14 and 15 are diagrams showing a simulation model. FIG. 14 is a plan view of a simulation model 30. FIG. 15 is a sectional view taken along a line G-G shown in FIG. 14. The simulation model 30 includes a rectangular substrate 31, a sensor chip (solid-state image pickup element) 33 bonded to a first face of the substrate 31 via a bonding agent 32, and a sealing resin 34 bonded to the first face of the substrate 31 so as to surround the sensor chip 33.

The simulation model 30 prepares a first simulation model in which an alumina substrate (having a thermal expansion coefficient of 7.2 ppm/° C.) is used as the substrate 31, and a second simulation model in which a silicon nitride substrate (having a thermal expansion coefficient of 3 ppm/° C.). As the sensor chip 33, the bonding agent 32 and the sealing resin 34, the same material (product) is used. The sensor chip 33 is formed of, for example, a CMOS sensor, and the material is formed of silicon (having a thermal expansion coefficient of 3 ppm/° C.).

The substrate 31 is 40.0 mm in lengthwise (Y-axis) direction, 48.0 mm in breadthwise (X-axis) direction and 0.3 mm in thickness (Z-axis) direction. The sensor chip 33 is 16.0 mm in lengthwise (Y-axis) direction, 24.0 mm in breadthwise (X-axis) direction and 0.725 mm in thickness (Z-axis) direction. The sensor chip 33 is connected to the substrate 31 by die bonding resin having a thickness of 0.05 mm. The sealing resin 34 is formed of a rectangular frame having a width of 4.0 mm and a thickness of 0.73 mm. The sealing resin 34 is formed of epoxy resin (having a thermal expansion coefficient of 11 ppm/° C.).

In the first and second simulation models 30, there is conducted simulation of warp caused when bonding of the sensor chip 33 and formation of the sealing resin 34 are conducted at a high temperature of 150° C. and then cooling to the normal temperature (20° C.) is conducted.

Figure 16:
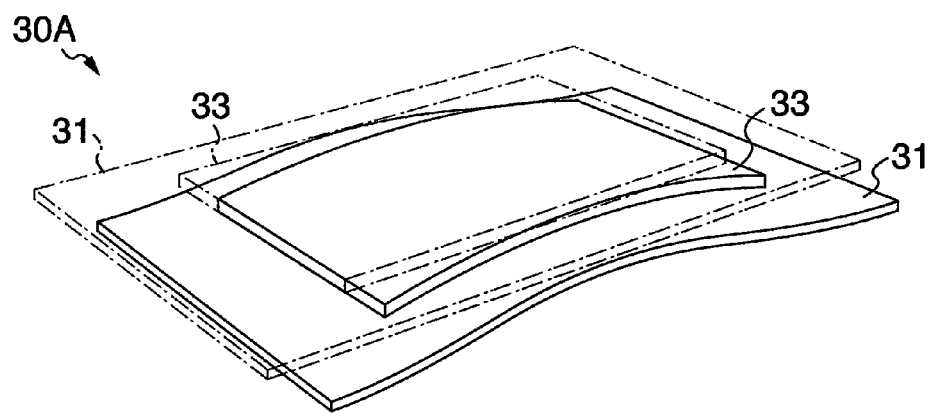
FIG. 16 is a schematic diagram showing a deformation state of a simulation model using an alumina substrate.
Figure 17:
FIG. 17 is a schematic diagram showing a warp state of the sensor chip on the alumina substrate.

FIG. 16 is a diagram showing a warp state of a first simulation model 30A in which the substrate 31 is formed of an alumina substrate, three-dimensionally. A state having no warp is represented by dot-dash lines. FIG. 17 is an enlarged view of the sensor chip 33. Warp f amounts to +48.3 μm. The sign "+" indicates warp in which the center side of the light sensing face of the sensor chip 33 protrudes so as to take a convex shape. In FIGS. 16 and 17, the sealing resin 34 is omitted to clarify the drawings.

Figure 18:
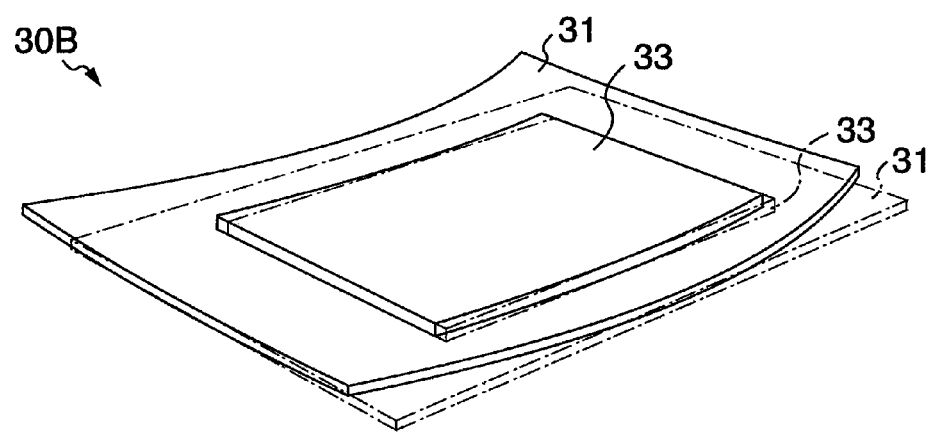
FIG. 18 is a schematic diagram showing a deformation state of a simulation model using a silicon nitride substrate.
Figure 19:
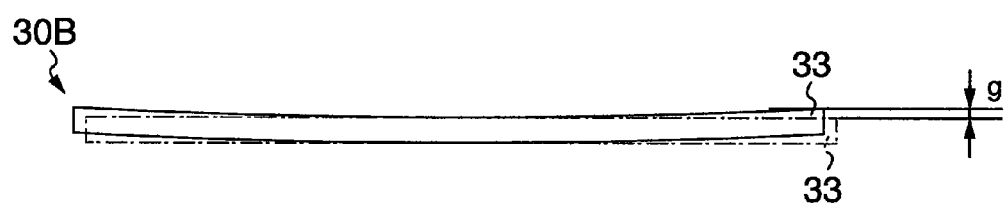
FIG. 19 is a schematic diagram showing a warp state of the sensor chip on the silicon nitride substrate.

FIG. 18 is a diagram showing a warp state of a second simulation model 30B in which the substrate 31 is formed of a silicon nitride substrate, three-dimensionally. A state having no warp is represented by dot-dash lines. FIG. 19 is an enlarged view of the sensor chip 33. Warp g amounts to −8.8 μm. The sign "−" indicates warp in which the center side of the light sensing face of the sensor chip 33 is depressed so as to take a concave shape. In FIGS. 18 and 19, the sealing resin 34 is omitted to clarify the drawings.

Due to the difference in thermal expansion coefficient, convex warp occurs in the first simulation model 30A using the alumina substrate as the substrate 31, whereas concave warp occurs in the second simulation model 30B using the silicon nitride substrate as the substrate 31.

Figure 20:
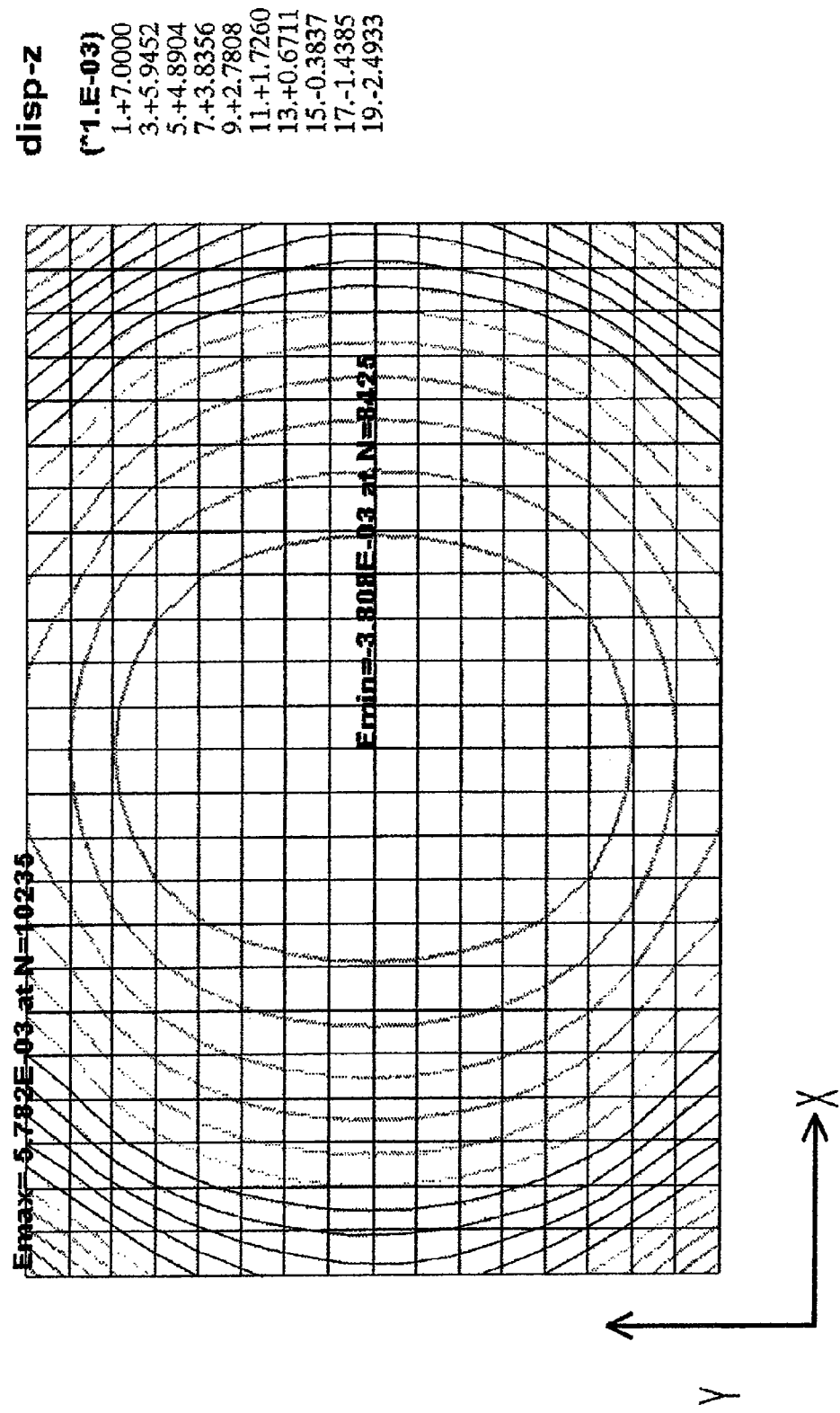
FIG. 20 is a schematic diagram showing height differences of a light sensing face of the sensor chip in the solid-state image pickup device according to the first embodiment.

In the first embodiment, therefore, the structure using silicon nitride as the substrate 31 is adopted. FIG. 20 is a height difference display example which indicates the warp state of the light sensing face of the solid-state image pickup element 13 in the solid-state image pickup device 1 according to the first embodiment. As shown at the rightmost end of FIG. 20, the range of −4 to 7 μm is divided into twenty stages displayed with different circle lines.

The warp quantity displayed at this time becomes the sum of absolute values between −4 μm and 7 μm, i.e., approximately 11 μm. (An accurate warp quantity becomes −8.95 μm.) Each of the contour lines takes the shape of an ellipse that is longer in the lengthwise direction. The major axis of the ellipse extends along the Y-axis direction, and the minor axis of the ellipse extends along the X-axis direction. The smallest elliptical region in the center is a stage including the most depressed part having a depression of −3.8 μm, and it corresponds to the lowest stage in the twenty stages shown at the rightmost end. The contour lines change so as to take similar shapes. The aspect ratio a/b of the warp becomes 0.81. According to the present invention, the aspect ratio a/b of the chip warp can be controlled by controlling the application pattern of the sealing resin 34. As a result, it is possible to bring the aspect ratio close to the ideal relation a/b=1.0.

Figure 21:
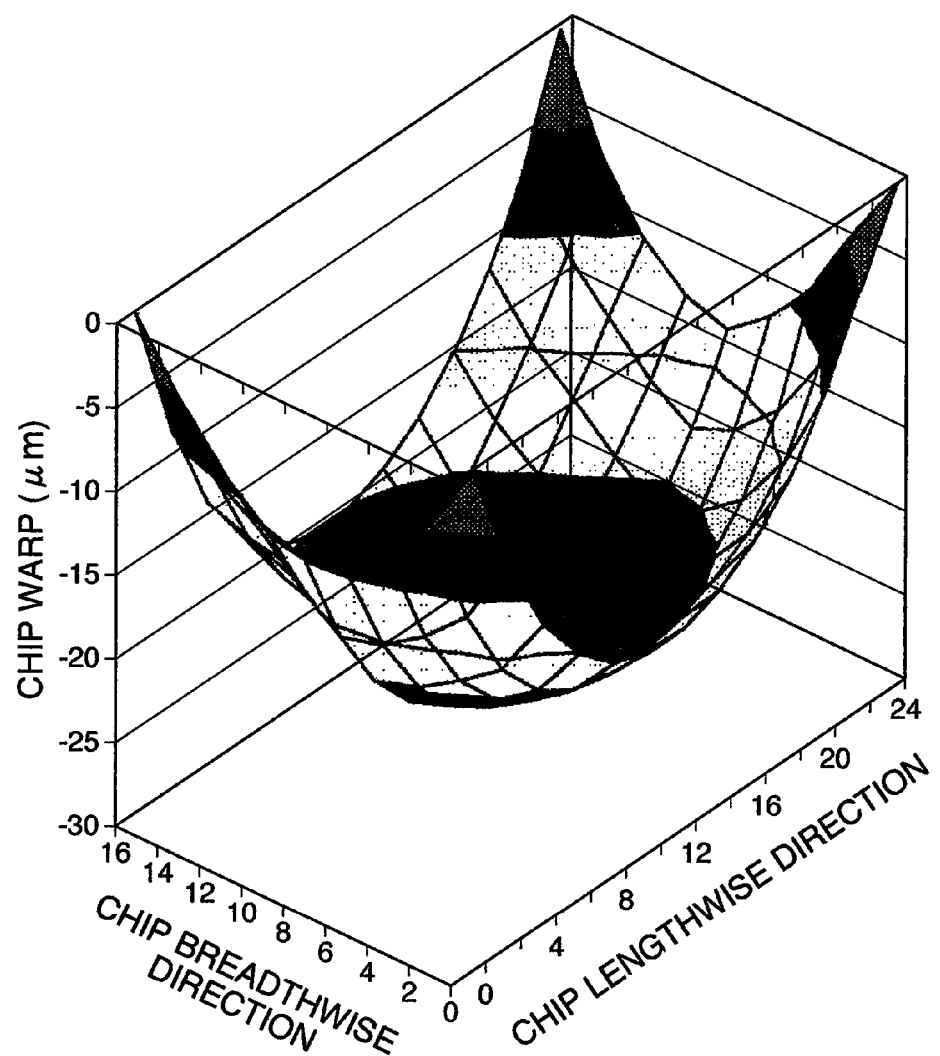
FIG. 21 is a three-dimensional model diagram showing warp measurement results of the light sensing face of the sensor chip in the solid-state image pickup device according to the first embodiment.

FIG. 21 is a model diagram which displays the concave warp of the solid-state image pickup element 13 (chip) three-dimensionally. The X-axis becomes the lengthwise direction (long side) of the chip. The Y-axis becomes the breadthwise direction (short side) of the chip. The Z-axis becomes the thickness direction of the chip. Warp appears in the Z-axis direction.

Figure 22:
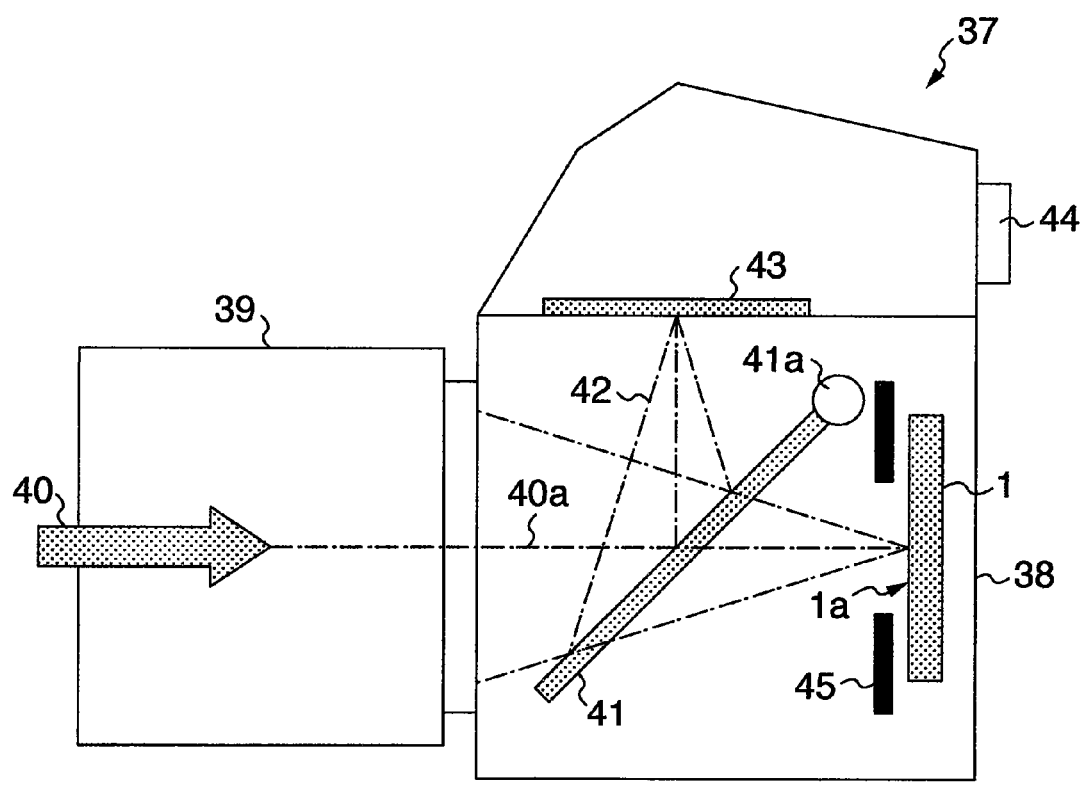
FIG. 22 is a schematic diagram of a camera in which the solid-state image pickup device according to the first embodiment is used.

The solid-state image pickup device 1 according to the first embodiment is used in, for example, a camera 37 shown in FIG. 22. The camera 37 has structure in which the solid-state image pickup device 1 is disposed at the back of a camera main body 38. A lens part 39 is disposed in front of the camera main body 38. A part of an optical system including optical lenses is incorporated in the lens part 39 to guide a light ray 40 to a light sensing face 1a of the solid-state image pickup device 1. A half mirror 41 is disposed in the camera main body 38. The half mirror 41 is disposed with a tilt angle of 45 degrees to an optical axis 40a of the light ray 40 which proceeds from the lens part 39 to the light sensing face 1a. The half mirror 41 is attached to a support shaft 41a at one end thereof so as to be freely rotatable. If a shutter of the camera which is not illustrated is pressed, the half mirror 41 is rotated upward by 45 degrees around the support shaft 41a to get out of a beam region of the light ray 40.

A monitoring beam 42 reflected by the half mirror 41 inclined by 45 degrees is led to a focusing screen 43 disposed at a distance equal to that from the light sensing face 1a to form an image. This formed image can be viewed from a finder 44. In other words, the formed image is converted to an erected image by a penta-prism which is not illustrated, and it can be viewed through an eye lens.

A focal plane shutter 45 activated to open and close by the shutter is disposed on the side of the light sensing face 1a of the solid-state image pickup device 1. If the shutter is pressed, the half mirror 41 is raised by 45 degrees to get out of the beam region of the light ray 40.

If the shutter is pressed, the half mirror 41 in the camera 37 is raised by 45 degrees to get out of the beam region of the light ray 40 and the focal plane shutter 45 is opened to take in an image to a film, i.e., the solid-state image pickup device 1. If the focal plane shutter 45 is closed, the half mirror 41 returns to the original position.

Figure 24A:
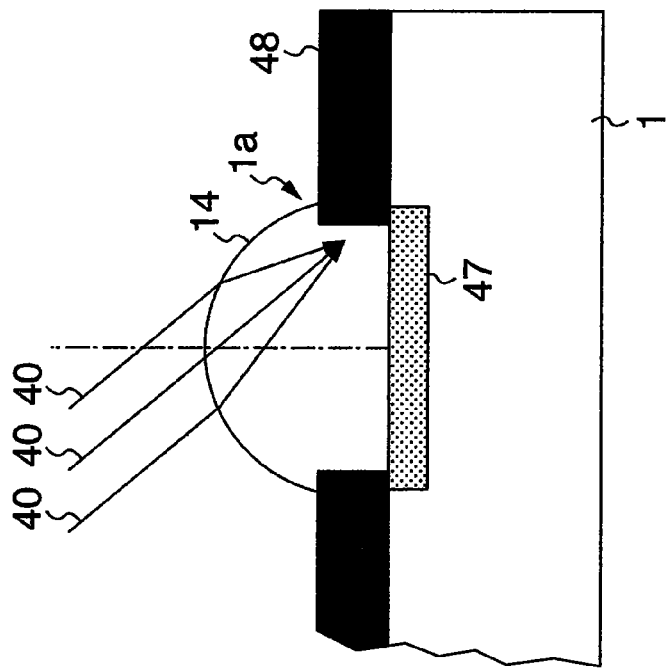
FIGS. 24A and 24B are schematic diagrams showing states of light incident on a rightmost lens respectively in the light incidence states shown in FIGS. 23A and 23B.
Figure 24B:
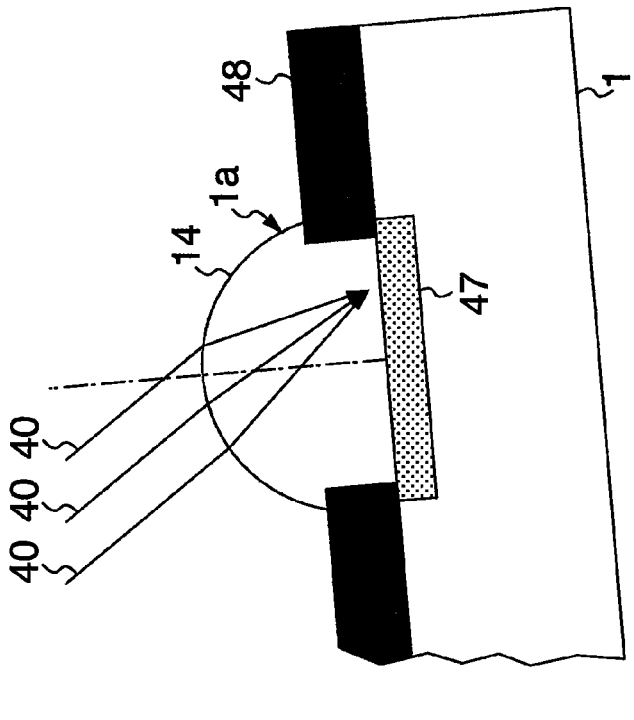
Figure 36:
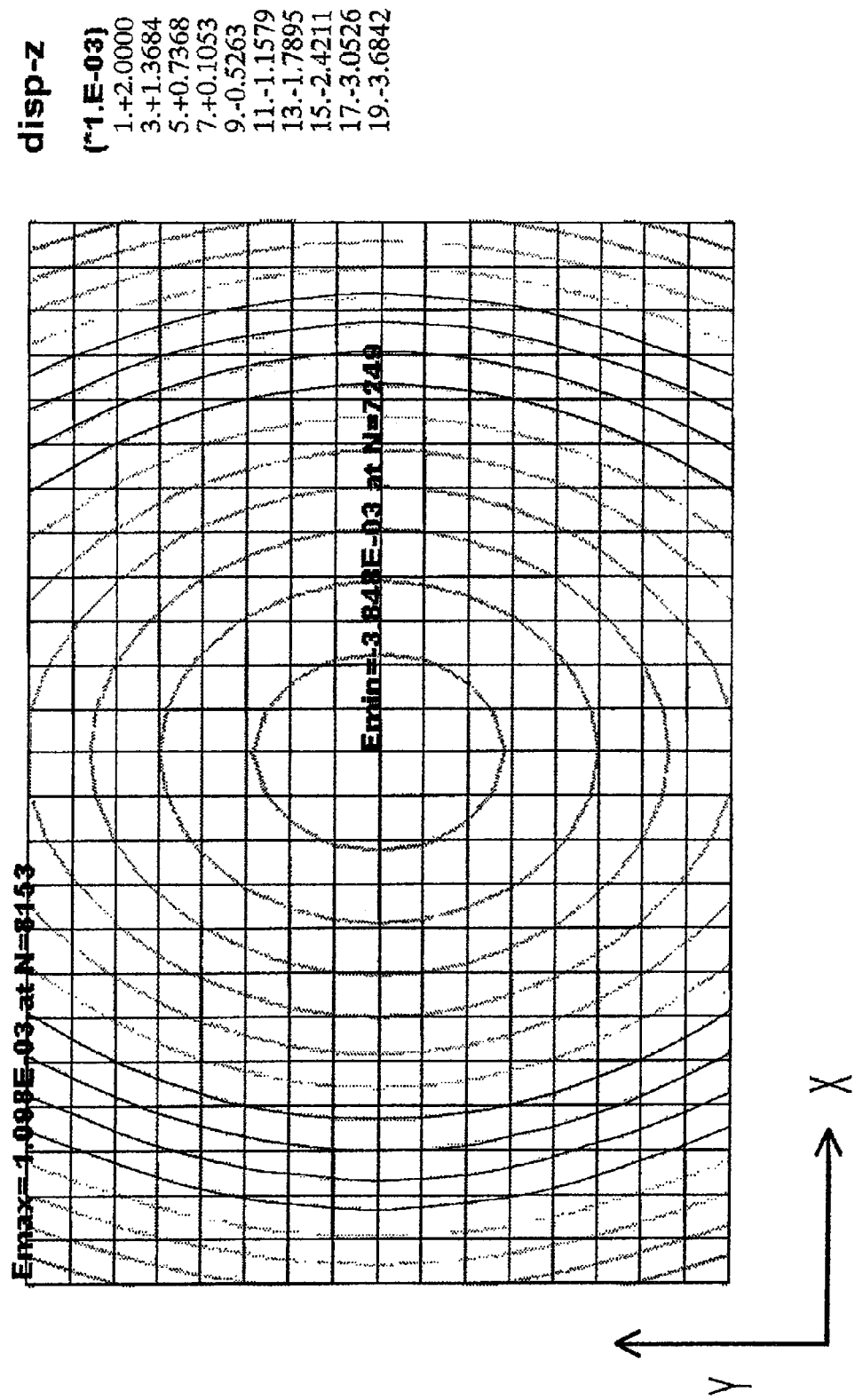
FIG. 36 is a diagram showing a model in which the substrate is smaller in thermal expansion coefficient than the chip as described in JP-A-2004-349545.

FIGS. 23A and 23B are diagrams showing relations between the light ray 40 passed through a camera lens 46 and the light sensing face 1a of the solid-state image pickup face 1a. In FIG. 23A, the light sensing face 1a of the solid-state image pickup device 1 has curvature of field. In FIG. 23B, the light sensing face 1a is flat. FIGS. 24A and 24B are schematic diagrams showing relations between the microlens 14 located at the outermost part (right end) of the solid-state image pickup device 1 and the light ray 40.

If the light sensing face 1a is flat, as shown in FIG. 24B, a light ray 40 that passes through the center of the camera lens 46 and arrives at the microlens 14 located in the outermost part of the solid-state image pickup device 1 is not taken in sufficiently by a sensor part 47 located right under the microlens 14. In other words, since the direction in which the light ray 40 entering the microlens 14 diagonally from above is refracted is shallow, the light ray 40 does not advance to the sensor part 47, but proceeds to an insulation film 48 disposed around the microlens 14.

On the other hand, in the solid-state image pickup device 1 in which the light sensing face 1a has curvature of field, the microlens 14 located in the outermost part of the solid-state image pickup device 1 is warped. As a result, the microlens 14 gets near the center of the camera lens 46. In this way, the microlens 14 located in the outermost part of the solid-state image pickup device 1 is warped so as to get near the center of the camera lens 46. Therefore, the direction in which the light ray 40 entering the microlens 14 diagonally from above is refracted becomes deep. Therefore, the light ray 40 does not proceed to the insulation film 48 around the microlens 14, but advances to the sensor part 47. As a result, the light ray 40 that has entered the microlens 14 located in the outermost part of the solid-state image pickup device 1 is taken in by the sensor part 47. Accordingly, the light quantity does not fall in the peripheral image part, either. As a result, a clear image can be obtained.

The solid-state image pickup device according to the first embodiment and the method for producing the device bring about effects described hereafter.

(1) The solid-state image pickup element 13 having a thermal expansion coefficient of 3.0 ppm/° C. is bonded to the substrate 2 having a thermal expansion coefficient of 3.0 ppm/° C. In addition, the contraction frame 17 is formed of epoxy resin having a thermal expansion coefficient of 11 ppm/° C. over the first face 2a of the substrate 2 so as to surround the solid-state image pickup element 13. The bonding and the heat treatment (curing) of the contraction frame 17 are conducted at a temperature of 150° C. Thereafter, the whole (including the substrate 2, the solid-state image pickup element 13 and the contraction frame 17) is cooled to the normal temperature (20° C.). The contraction frame 17 has a thermal expansion coefficient that is approximately four times as large as that of the substrate 2 and the solid-state image pickup element 13. At the normal temperature, therefore, the contraction frame 17 generates stress so as to wring the substrate 2 and the solid-state image pickup element 13. As a result, the light sensing face of the solid-state image pickup element 13 is warped so as to take a concave shape. The contraction frame 17 which generates the warp varies diversely depending upon the sectional area, i.e., the width and height of the contraction frame 17. Therefore, the warp can be made approximately equal to the curvature of field of the optical system including the lens that guides light (beam) to the light sensing face of the solid-state image pickup device 1, by selecting the dimensions.

(2) Each of the substrate 2 and the solid-state image pickup element 13 is warped so as to take a concave shape by contraction of the contraction frame 17. Therefore, curvatures of warps along the long side and the short side of the solid-state image pickup element 13 can be adjusted by selecting the width and height of the contraction frame 17. As a result, warp of the light sensing face of the solid-state image pickup element 13 can be made to coincide with or be approximate to the curvature of field. In the conventional technique of warping the light sensing face of the solid-state image pickup element by bonding and curing the substrate and the solid-state image pickup element that are different from each other in thermal expansion coefficient, at a high temperature and then cooling them to the normal temperature, the degree of the warp depends upon dimensions of the solid-state image pickup element and the substrate stuck to each other and becomes constant. In other words, the warp cannot be adjusted in the conventional sticking method. According to the present invention, however, the degree of warp in each direction of the light sensing face of the solid-state image pickup element 13 can be adjusted by selecting the shape of the contraction frame 17 and dimensions of the contraction frame 17.

(3) The warp of the light sensing face of the solid-state image pickup element 13 is formed according to the method described in (2). If the solid-state image pickup device 1 is incorporated into a camera or the like, the so-called tilting phenomenon, in which light from an optical axis of the lenses does not become perpendicular to the light sensing face of the solid-state image pickup element 13 but is tilted, becomes inapt to occur in assembling the solid-state image pickup element 13 to lenses of the camera. This eliminates the need for the tilting correction work when the solid-state image pickup device 1 according to the present invention is used in an optical device such as a camera, i.e., tilting correction work of correcting the position and angle so as to make the light from the lens optical axis perpendicular to the light sensing face of the solid-state image pickup element 13.

(4) As described in (2), the warp of the light sensing face of the solid-state image pickup element 13 can be made to coincide with or be approximate to the curvature of field. When the solid-state image pickup device is used in an optical device, therefore, it is possible to improve the image forming performance in conjunction with the optical system including lenses.

(5) As described in (2), the warp of the light sensing face of the solid-state image pickup element 13 can be made to coincide with or be approximate to the curvature of field. When the solid-state image pickup device is used in an optical device, therefore, correction for the lens curvature of field becomes unnecessary. In this case, it becomes possible to reduce the number of lenses included in the optical system, because the correction for the lens curvature of field becomes unnecessary.

(6) Since the solid-state image pickup element 13 is bonded to the substrate formed of silicon nitride having a favorable thermal conduction property (having a thermal conductivity of 90 W/m·K), heat generated in the solid-state image pickup element 13 can be radiated to the outside via the substrate quickly. When the solid-state image pickup device is used in a camera, therefore, exposure to light for a long time becomes possible. For example, it is also possible to take an image of a night view beautifully by conducting exposure to light for a long time.

(7) As described in (2), the warp of the light sensing face of the solid-state image pickup element 13 can be made to coincide with or be approximate to the curvature of field. As for the light receiving quantity in the image peripheral part as well, the same light quantity as that in the image center part can be taken in, and a clear image can be obtained. In the color video image, therefore, it becomes possible to unify the color density in the image center and in the image peripheral part.

(8) The solid-state image pickup device 1 has a structure in which the solid-state image pickup element 13 is bonded to the first face 2a of the substrate 2 and the contraction frame 17 is provided so as to surround the solid-state image pickup element 13. In the solid-state image pickup device 1 according to the present invention, therefore, it is not necessary to provide the package main body with a depressed structure and the lid is not needed, unlike the conventional cer-DIP structure. This brings about an effect that thin light-weight products are obtained. In addition, the production cost of the solid-state image pickup device 1 can also be reduced owing to reduction of the number of components.

(9) In the concave warp of the light sensing face of the solid-state image pickup element 13 in the solid-state image pickup device 1, the aspect ratio a/b of the chip warp becomes 0.81. In the optical design, it is desirable that the aspect ratio a/b of the chip warp is close to 1.0. As compared with the aspect ratio a/b=0.78 of the chip warp obtained when invar is used for the substrate as in JP-A-2003-243635, the aspect ratio 0.81 in the present invention is closer to a/b=1.0. In addition, the present invention has a feature that a/b can be brought close to 1.0 by controlling the application pattern of the sealing resin 34 as described above. This brings about an effect that the whole image becomes clearer.

Figure 39:
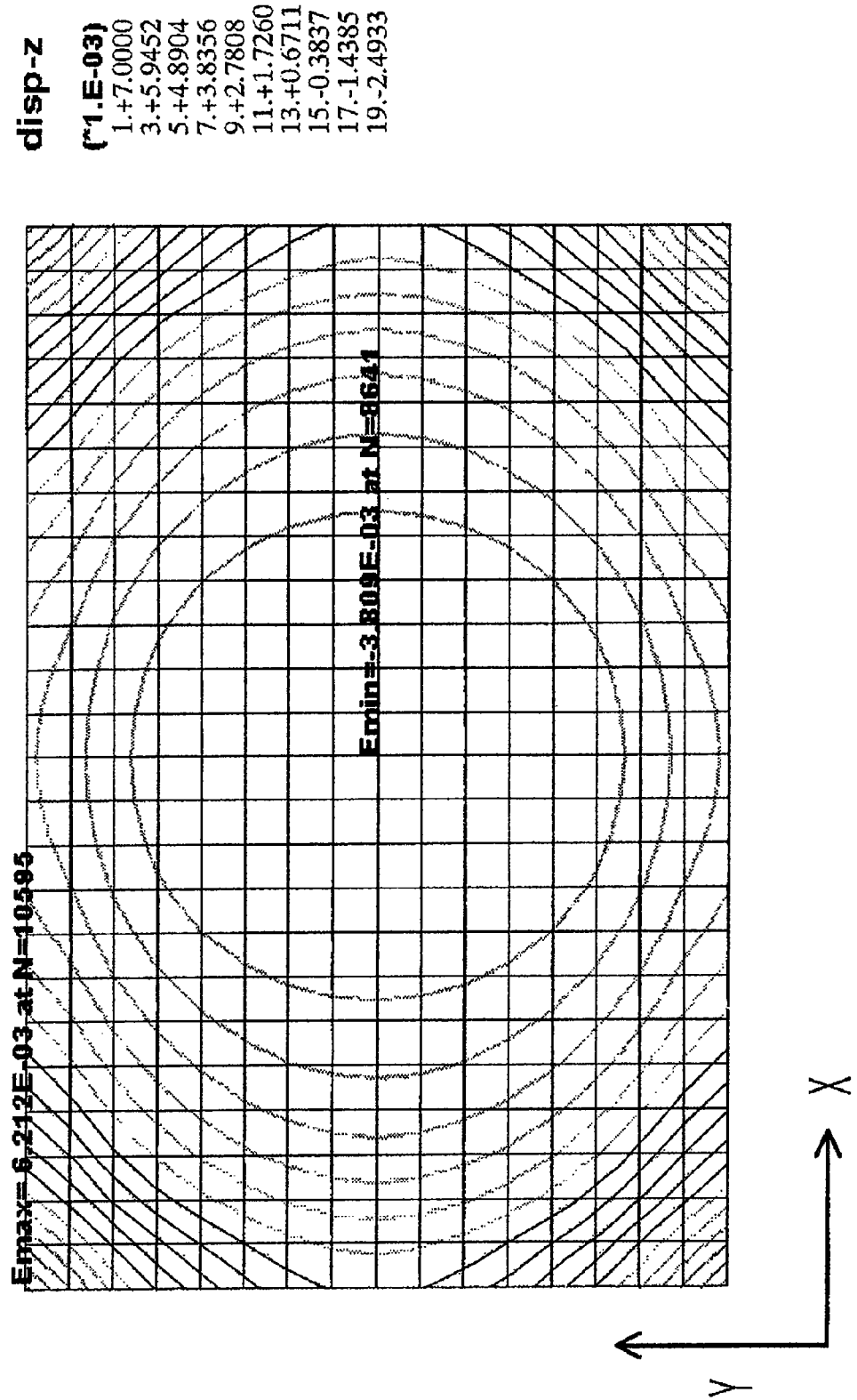
FIG. 39 shows a height difference display example showing a warp state of a light sensing face of a sensor chip obtained by simulation analysis when a resin application pattern shown in FIG. 31 is used.

As one of examples in which a/b is brought close to 1.0, it is effective to use a resin application pattern as shown in FIG. 31. FIG. 39 shows a height difference display example showing the warp state of the light sensing face of the sensor chip obtained by simulation analysis when the resin application pattern shown in FIG. 31 is used. As shown at the rightmost end of FIG. 39, the range of −4 to 7 μm is divided into twenty stages displayed with different circle lines. The warp quantity displayed at this time becomes the sum of absolute values between −4 μm and 7 μm, i.e., approximately 11 μm. (An accurate warp quantity becomes −9.42 μm.)

The smallest circular region in the center is a stage including the most depressed part having a depression of −3.8 μm, and it corresponds to the lowest stage in the twenty stages shown at the rightmost end. The aspect ratio a/b of the chip warp becomes 0.98.

SECOND EMBODIMENT

FIGS. 25 and 26 are diagrams relating to a solid-state image pickup device according to a second embodiment of the present invention. FIG. 25 is a schematic plan view of the solid-state image pickup device. FIG. 26 is a sectional view taken along a line H-H shown in FIG. 25.

The solid-state image pickup device 1 according to the second embodiment is obtained by bonding a transparent protection substance 22 to the light sensing face of the solid-state image pickup element 13 via a transparent bonding agent 21, after the process of the contraction frame forming (S04) in the production method for the solid-state image pickup device 1 according to the first embodiment. After the contraction frame formation, the light sensing face of the solid-state image pickup element 13 has warp so as to take a concave shape. Therefore, the protection substance 22 needs to be formed of a flexible material so as to follow the warp of the light sensing face of the solid-state image pickup element 13. As the bonding agent 21, for example, a bonding agent of ultraviolet ray curing type is used.

According to the second embodiment, it becomes possible to protect the light sensing face of the solid-state image pickup element 13 with the protection substance 22, resulting in further improved reliability of the solid-state image pickup device 1. Furthermore, since the protection substance 22 is bonded to the light sensing face of the solid-state image pickup device 1 by using the bonding agent 21 of ultraviolet ray curing type, there is also an advantage that the warp of the light sensing face of the solid-state image pickup element 13 can be further increased by curing contraction of the bonding agent 21 of ultraviolet ray curing type.

THIRD EMBODIMENT

FIGS. 27 and 28 are diagrams relating to a solid-state image pickup device according to a third embodiment of the present invention. FIG. 27 is a schematic plan view of the solid-state image pickup device. FIG. 28 is a sectional view taken along a line I-I shown in FIG. 27.

The solid-state image pickup device 1 according to the third embodiment is obtained by connecting the electrodes 15 (not illustrated) of the solid-state image pickup element 13 to the electrode pads 9 (not illustrated) of the flexible printed circuit boards 3 with wiring 23 having tape instead of wires in the production method for the solid-state image pickup device 1 according to the first embodiment. The wiring 23 having tape includes insulative tape 24 and a plurality of wires 25 formed on one face of the tape 24. First ends of the wires 25 are connected to the electrodes 15, and second ends of the wires 25 are connected to the electrode pads 9. It is also possible to use a structure in which parts of the wires 25 except parts connected to the electrode pads 9 and the electrodes 15 are covered by an insulative protection film.

In the solid-state image pickup device 1 according to the third embodiment, the contraction frame 17 is provided so as to warp outside the wiring 23 having tape.

In the production method for the solid-state image pickup device 1 according to the third embodiment as well, the light sensing face of the solid-state image pickup element 13 can be warped so as to take a concave shape.

FOURTH EMBODIMENT

FIGS. 29 and 30 are diagrams relating to a solid-state image pickup device according to a fourth embodiment of the present invention. FIG. 29 is a schematic plan view of the solid-state image pickup device. FIG. 30 is a sectional view taken along a line J-J shown in FIG. 29.

The solid-state image pickup device 1 according to the fourth embodiment is obtained by using flip-chip connection as connection means for the solid-state image pickup element 13 in the production method for the solid-state image pickup device 1 according to the third embodiment. In other words, electrodes are not provided on the first face of the solid-state image pickup element 13, but electrodes 15a for flip-chip connection are provided on the second face of the solid-state image pickup element 13. The electrodes 15a are flip-chip connected to the electrode pads 9 (not illustrated) of the flexible printed circuit boards 3. Therefore, inner sides of the flexible printed circuit boards 3 extend up to the bottom faces of the solid-state image pickup element 13.

In the production method for the solid-state image pickup device 1 according to the fourth embodiment as well, the light sensing face of the solid-state image pickup element 13 can be warped so as to take a concave shape.

FIFTH EMBODIMENT

FIGS. 31 and 32 are diagrams relating to a solid-state image pickup device according to a fifth embodiment of the present invention. FIG. 31 is a schematic plan view of the solid-state image pickup device. FIG. 32 is a sectional view taken along a line K-K shown in FIG. 31.

The solid-state image pickup device 1 according to the fifth embodiment is obtained by projecting a partial region of the contraction frame 17 to the outside of the contraction frame 17 as shown in FIG. 31 in the contraction frame formation (S04) in the production method for the solid-state image pickup device 1 according to the first embodiment. In the embodiment, a projection 26 has a shape obtained by projecting a middle part of a side of the contraction frame 17 extending along the Y direction toward the outside of the contraction frame 17 along the X direction by a predetermined dimension.

In this way, the projection part 26 is provided. When the contraction frame 17 is cooled, therefore, contraction force of the projection part 26 is applied to the substrate 2 and the solid-state image pickup element 13, and the warp along the X direction is increased. It becomes possible to subtly adjust the degree (such as the length and curvature) of warp in the direction of the plane XY by thus providing the projection part 26.

SIXTH EMBODIMENT

FIGS. 33 to 35 are diagrams relating to a solid-state image pickup device according to a sixth embodiment of the present invention. FIG. 33 is a schematic plan view of the solid-state image pickup device. FIG. 34 is a sectional view taken along a line L-L shown in FIG. 33. FIG. 35 is a bottom view of the solid-state image pickup device.

The solid-state image pickup device 1 according to the sixth embodiment is obtained by covering the wires 16 with insulative resin to form protection substances 27 and refraining from providing the contraction frame 17 over the first face 2a of the substrate 2 as shown in FIGS. 33 and 34, in the production method for the solid-state image pickup device 1 according to the first embodiment. Instead, the contraction frame 17 is provided on the second face 2b of the substrate 2. A region surrounded by the contraction frame 17 is a region that becomes the back side face of a region in which the solid-state image pickup element 13 is fixed.

In the sixth embodiment, the contraction frame 17 is provided on the second face 2b of the substrate 2. Therefore, warp that causes the light sensing face of the solid-state image pickup element 13 to become a convex face may be provided.

Heretofore, the present invention has been described concretely on the basis of the embodiments. As a matter of course, however, the present invention is not restricted to the embodiments, but various changes can be made without departing from the spirit of the invention.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A solid-state image pickup device comprising:
a substrate having a first face and a second face which serves as an opposite face of the first face;
a solid-state image pickup element having a plurality of electrodes and having a light sensing part on a first face thereof, a second face of the solid-state image pickup element serving as an opposite face of the first face being bonded to the first face of the substrate via a bonding agent;
a plurality of wires formed over the first face of the substrate, first ends of the wires serving as external electrode terminals; and
connection means for electrically connecting the electrodes of the solid-state image pickup element to the wires, respectively,
wherein
a contraction frame formed of resin that is larger in thermal expansion coefficient than the substrate and the solid-state image pickup element is bonded to and formed on a surface side of the substrate located outside the light sensing part of the solid-state image pickup element so as to surround the light sensing part, and
a light sensing face of the light sensing part of the solid-state image pickup element is warped.

2. The solid-state image pickup device according to claim 1, wherein the contraction frame takes an endless shape.

3. The solid-state image pickup device according to claim 1, wherein the contraction frame takes a shape projected to outside of the contraction frame in a partial region thereof.

4. The solid-state image pickup device according to claim 1, wherein
the contraction frame is formed over the face of the substrate, and
the light sensing face of the solid-state image pickup element is warped so as to take a concave shape.

5. The solid-state image pickup device according to claim 1, wherein
the contraction frame is formed on the second face of the substrate, and
the light sensing face of the solid-state image pickup element is warped so as to take a convex shape.

6. The solid-state image pickup device according to claim 1, wherein a material forming the solid-state image pickup element is close in thermal expansion coefficient to a material forming the substrate.

7. The solid-state image pickup device according to claim 1, wherein
the solid-state image pickup element is formed of silicon having a thermal expansion coefficient of approximately 3 ppm/° C.,
the substrate is formed of a material having a thermal expansion coefficient of approximately 3 ppm/° C. which is close to the thermal expansion coefficient of silicon, and
the contraction frame is formed of epoxy resin having a thermal expansion coefficient of approximately 11 ppm/° C.

8. The solid-state image pickup device according to claim 1, wherein
the electrodes of the solid-state image pickup element are connected to the wires via conductive wires, respectively, and
the wires are buried in the contraction frame.

9. The solid-state image pickup device according to claim 1, wherein the wires are formed by bonding flexible printed circuit boards each including insulative tape and a plurality of wires provided on one face of the tape to the first face of the substrate.

10. The solid-state image pickup device according to claim 1, wherein a transparent protection substance is bonded to whole area of the light sensing face of the solid-state image pickup element via a transparent bonding agent.

* * * * *